(12) United States Patent
Nagatsuka et al.

(10) Patent No.: US 8,441,841 B2
(45) Date of Patent: May 14, 2013

(54) SEMICONDUCTOR DEVICE AND DRIVING METHOD OF SEMICONDUCTOR DEVICE

(75) Inventors: Shuhei Nagatsuka, Atsugi (JP); Kiyoshi Kato, Atsugi (JP); Takanori Matsuzaki, Atsugi (JP); Hiroki Inoue, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 277 days.

(21) Appl. No.: 13/027,546

(22) Filed: Feb. 15, 2011

(65) Prior Publication Data

US 2011/0205785 A1    Aug. 25, 2011

(30) Foreign Application Priority Data

Feb. 19, 2010    (JP) .................................. 2010-035386

(51) Int. Cl.
*G11C 11/24*    (2006.01)
(52) U.S. Cl.
USPC .. 365/149; 365/194; 365/189.09; 365/189.11
(58) Field of Classification Search ............... 365/149, 365/19, 189.09, 189.114
See application file for complete search history.

(56) References Cited

U.S. PATENT DOCUMENTS

| | | |
|---|---|---|
| 4,466,081 A | 8/1984 | Masuoka |
| 5,731,856 A | 3/1998 | Kim et al. |
| 5,744,864 A | 4/1998 | Cillessen et al. |
| 5,753,946 A * | 5/1998 | Naiki et al. ............... 257/295 |
| 6,127,702 A | 10/2000 | Yamazaki et al. |
| 6,294,274 B1 | 9/2001 | Kawazoe et al. |
| 6,452,858 B1 | 9/2002 | Hanzawa et al. |
| 6,563,174 B2 | 5/2003 | Kawasaki et al. |
| 6,576,943 B1 | 6/2003 | Ishii et al. |
| 6,727,522 B1 | 4/2004 | Kawasaki et al. |

(Continued)

FOREIGN PATENT DOCUMENTS

| | | |
|---|---|---|
| EP | 0 053 878 | 6/1982 |
| EP | 1134811 A | 9/2001 |

(Continued)

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

(Continued)

*Primary Examiner* — Hoai V Ho
(74) *Attorney, Agent, or Firm* — Eric J. Robinson; Robinson Intellectual Property Law Office, P.C.

(57) ABSTRACT

An object is to provide a semiconductor device with a novel structure, which can hold stored data even when not powered and which has an unlimited number of write cycles. A semiconductor device includes a memory cell including a widegap semiconductor, for example, an oxide semiconductor and the semiconductor device includes a potential conversion circuit which functions to output a potential lower than a reference potential for reading data from the memory cell. With the use of a widegap semiconductor, a semiconductor device capable of sufficiently reducing the off-state current of a transistor included in a memory cell and capable of holding data for a long time can be provided.

14 Claims, 25 Drawing Sheets

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0114186 A1 | 8/2002 | Ito |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0227648 A1* | 10/2006 | Kameshiro et al. ...... 365/230.05 |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0165704 A1* | 7/2010 | Wu et al. ...................... 365/149 |

FOREIGN PATENT DOCUMENTS

| | | |
|---|---|---|
| EP | 1737044 A | 12/2006 |
| EP | 1746659 A | 1/2007 |
| EP | 2226847 A | 9/2010 |
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-269457 A | 9/2000 |
| JP | 2001-195879 A | 7/2001 |
| JP | 2002-076356 A | 3/2002 |
| JP | 2002-245777 A | 8/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-00/30183 | 5/2000 |
| WO | WO-00/55920 | 9/2000 |
| WO | WO-2004/114391 | 12/2004 |

OTHER PUBLICATIONS

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '8 : Proceedings of the 15th International Display Workshops, Dec. 3, 3008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater, (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 : Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-BO Systems [A; Fe, Ga, Or Al; B; Mg, Mn, Fe, Ni, Cu,Or Zn] at Temperatires Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2011/052197) Dated May 10, 2011.

Written Opinion (Application No. PCT/JP2011/052197) Dated May 10, 2011.

* cited by examiner

SEMICONDUCTOR DEVICE AND DRIVING METHOD OF SEMICONDUCTOR DEVICE

TECHNICAL FIELD

The invention disclosed herein relates to a semiconductor device including a semiconductor element and a driving method of the semiconductor device.

BACKGROUND ART

Memory devices using semiconductor elements are broadly classified into two categories: a volatile memory device that loses stored data when not powered, and a nonvolatile memory device that holds stored data even when not powered.

A typical example of a volatile memory device is a dynamic random access memory (DRAM). A DRAM stores data in such a manner that a transistor included in a memory element is selected and electric charge is stored in a capacitor.

When data is read from a DRAM, electric charge in a capacitor is lost according to the above-described principle; thus, another writing operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per storage capacity is higher because a circuit such as a flip-flop is used. Moreover, as in a DRAM, stored data in an SRAM is lost when power supply stops.

A typical example of a nonvolatile memory device is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to a volatile memory device is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of lifetime is not resolved. In other words, a flash memory is not suitable for applications in which data is frequently rewritten.

In addition, high voltage is necessary in order to inject charge into the floating gate or removing the charge, and a circuit therefor is required. Further, it takes a relatively long time to inject or remove electric charge, and it is not easy to increase the speed of writing and erasing data.

REFERENCE

[Patent Document 1] Japanese Published Patent Application No. S57-105889

DISCLOSURE OF INVENTION

In view of the foregoing problems, an object of one embodiment of the disclosed invention is to provide a semiconductor device with a novel structure, which can hold stored data even when not powered and which has an unlimited number of write cycles.

In the disclosed invention, a semiconductor device is formed using a material capable of sufficiently reducing the off-state current of a transistor, such as an oxide semiconductor material that is a widegap semiconductor. The use of a semiconductor material capable of sufficiently reducing the off-state current of a transistor allows data to be held for a long time.

In the disclosed invention, a semiconductor device includes a memory cell formed using a widegap semiconductor, for example, and the semiconductor device includes a potential conversion circuit which functions to output a potential lower than a reference potential for reading data from the memory cell.

More specifically, the following structures can be employed, for example.

An embodiment of the present invention is a semiconductor device which includes a write word line, a read word line, a bit line, a source line, a signal line, a memory cell array having a plurality of memory cells, a first driver circuit, a second driver circuit, and a potential conversion circuit. One of the memory cells includes a first transistor which includes a first gate electrode, a first source electrode, a first drain electrode, and a first channel formation region, a second transistor which includes a second gate electrode, a second source electrode, a second drain electrode, and a second channel formation region, and a capacitor. The first channel formation region includes a semiconductor material different from that of the second channel formation region. The first gate electrode, the second drain electrode, and one electrode of the capacitor are electrically connected to each other and form a node where electric charge is held. The first driver circuit is electrically connected to the first drain electrode through the bit line and electrically connected to the second source electrode through the signal line. The second driver circuit is electrically connected to the other electrode of the capacitor through the read word line and electrically connected to the second gate electrode through the write word line. The potential conversion circuit outputs a potential lower than a reference potential to the second driver circuit.

An embodiment of the present invention is a semiconductor device which includes a write word line, a read word line, a bit line, a source line, a signal line, a memory cell array having a plurality of memory cells, a first driver circuit, a second driver circuit, and a potential conversion circuit. One of the memory cells includes a first transistor which includes a first gate electrode, a first source electrode, a first drain electrode, and a first channel formation region, a second transistor which includes a second gate electrode, a second source electrode, a second drain electrode, and a second channel formation region, and a capacitor. The first channel formation region includes a semiconductor material different from that of the second channel formation region. The first gate electrode, the second drain electrode, and one electrode of the capacitor are electrically connected to each other and form a node where electric charge is held. The first driver circuit is electrically connected to the first drain electrode through the bit line and electrically connected to the second source electrode through the signal line. The second driver circuit is electrically connected to the other electrode of the capacitor through the read word line and electrically connected to the second gate electrode through the write word line. The potential conversion circuit outputs a potential lower than a reference potential and a potential higher than a power supply potential to the second driver circuit.

In any of the above semiconductor devices, the plurality of memory cells may be connected in parallel between the bit line and the source line.

In any of the above semiconductor devices, the second channel formation region of the second transistor may include an oxide semiconductor.

In any of the above semiconductor devices, the first driver circuit may include a delay circuit electrically connected to the signal line.

In any of the above semiconductor devices, the second driver circuit may include a level shift circuit electrically connected to the potential conversion circuit and the write word line or the read word line.

Note that although, in the above embodiments, the transistor may be formed using an oxide semiconductor, the disclosed invention is not limited thereto. A material capable of realizing off-state current characteristics comparable to those of an oxide semiconductor, for example, a widegap material (specifically, a semiconductor material having an energy gap Eg of more than 3 eV, for example), such as silicon carbide, or the like may be employed.

Note that the term such as "over" or "below" in this specification and the like does not necessarily mean that a component is placed "directly on" or "directly under" another component. For example, the expression "a gate electrode over a gate insulating layer" does not exclude the case where a component is placed between the gate insulating layer and the gate electrode.

In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification and the like.

Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions, as well as an electrode and a wiring.

Since the off-state current of a transistor including an oxide semiconductor is extremely small, stored data can be held for an extremely long period by using the transistor. In other words, refresh operation becomes unnecessary or the frequency of the refresh operation can be extremely low, which leads to a sufficient reduction in power consumption. Moreover, stored data can be held for a long period even when power is not supplied (note that the potential is preferably fixed).

Further, a semiconductor device according to the disclosed invention does not need high voltage for data writing and does not have the problem of element deterioration. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention has no limitation on the number of times data can be rewritten, which is a problem of a conventional nonvolatile memory, and the reliability thereof is drastically improved. Furthermore, since data is written by turning on or off the transistor, high-speed operation can be easily realized. Additionally, there is an advantage in that operation for erasing data is not needed.

Since a transistor including a material other than an oxide semiconductor can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to operate at high speed.

A semiconductor device having a novel feature can be realized by being provided with both the transistor including a material other than an oxide semiconductor (in other words, a transistor capable of operating at sufficiently high speed) and the transistor including an oxide semiconductor (in other words, a transistor whose off-state current is sufficiently small).

BEST MODE FOR CARRYING OUT THE INVENTION

Figures 1, 1A:
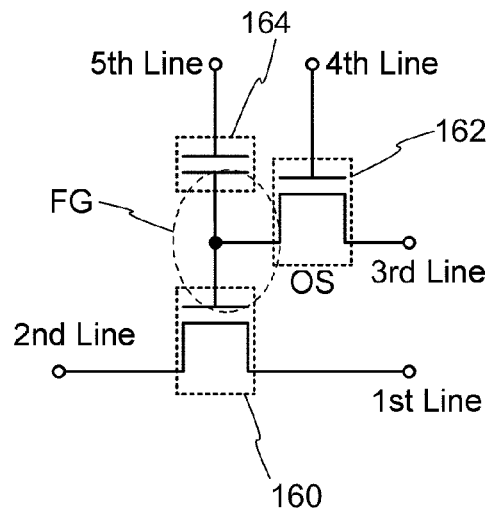
FIGS. 1A-1, 1A-2, and 1B are circuit diagrams of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and the scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a circuit structure and an operation of a semiconductor device according to one embodiment of the disclosed invention will be described with reference to FIGS. 1A-1, 1A-2, and 1B, FIGS. 2A and 2B, FIG. 3, FIG. 4, FIGS. 5A and 5B, FIGS. 6A to 6D, FIGS. 7A and 7B, FIG. 8, and FIGS. 9A and 9B. Note that in some circuit diagrams mentioned below, "OS" is written beside a transistor in order to indicate that the transistor includes an oxide semiconductor.

First, a basic circuit structure and an operation thereof will be described with reference to FIGS. 1A-1, 1A-2, and 1B. In a semiconductor device illustrated in FIG. 1A-1, a first wiring (1st Line) is electrically connected to a source electrode (or a drain electrode) of a transistor 160. A second wiring (2nd Line) is electrically connected to the drain electrode (or the source electrode) of the transistor 160. A third wiring (3rd Line) is electrically connected to a source electrode (or a drain electrode) of a transistor 162. A fourth wiring (4th Line) is electrically connected to a gate electrode of the transistor 162. Furthermore, a gate electrode of the transistor 160 and the drain electrode (or the source electrode) of the transistor 162 are electrically connected to one electrode of a capacitor 164. A fifth wiring (5th Line) is electrically connected to the other electrode of the capacitor 164.

Here, a transistor including an oxide semiconductor is used as the transistor 162, for example. A transistor including an oxide semiconductor has a characteristic of a significantly small off-state current. For that reason, a potential of the gate electrode of the transistor 160 can be held for an extremely long period by turning off the transistor 162. By providing the capacitor 164, holding of charge applied to the gate electrode of the transistor 160 and reading of data held can be performed more easily.

Note that there is no particular limitation on the transistor 160. In terms of increasing the speed of reading data, it is preferable to use a transistor with high switching speed such as a transistor formed using single crystal silicon, for example.

Figure 1B:
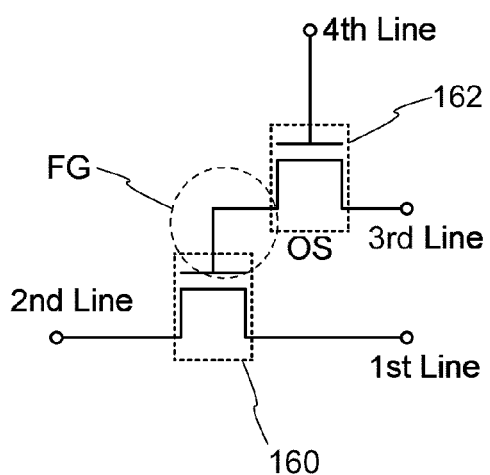

Alternatively, a structure in which the capacitor 164 is not provided is also possible as illustrated in FIG. 1B.

The semiconductor device in FIG. 1A-1 utilizes a characteristic in which the potential of the gate electrode of the transistor 160 can be held, and can thus write, hold, and read data as follows.

First of all, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potentials (hereinafter, a charge providing a low potential is referred to as charge $Q_L$ and a charge providing a high potential is referred to as charge $Q_H$) is applied. Note that charges providing three or more different potentials may be applied to improve storage capacity. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (reading potential) to the fifth wiring while a predetermined potential (a constant potential) is supplied to the first wiring, the potential of the second wiring varies depending on the amount of charge held at the gate electrode of the transistor 160. This is generally because, when the transistor 160 is an n-channel transistor, an apparent threshold voltage $V_{th\_H}$ in the case where $Q_H$ is supplied to the gate electrode of the transistor 160 is lower than an apparent threshold voltage $V_{th\_L}$ in the case where $Q_L$ is supplied to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge supplied to the gate electrode of the transistor 160 can be determined. For example, in the case where $Q_H$ is supplied in writing, when the potential of the fifth wiring is $V_0$ ($>V_{th\_H}$), the transistor 160 is turned on. In the case where $Q_L$ is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed to be used, it is necessary that only data of a desired memory cell can be read. When data of a predetermined memory cell is read and data of the other memory cells is not read, in the case where the transistors 160 are connected in parallel among the memory cells, fifth wirings in memory cells that are not a target for reading are supplied with a potential at which the transistors 160 are turned off regardless of the state of the gate electrodes, that is, a potential lower than $V_{th\_H}$. On the other hand, in the case where the transistors 160 are connected in series among the memory cells, fifth wirings in memory cells that are not a target for reading are supplied with a potential at which the transistors 160 are turned on regardless of the state of the gate electrodes, that is, a potential higher than $V_{th\_L}$.

Next, rewriting of data will be described. Rewriting of data is performed in a manner similar to that of the writing and holding of data. In other words, the potential of the fourth wiring is set to a potential at which the transistor 162 is turned on, so that the transistor 162 is turned on. Accordingly, the potential of the third wiring (a potential for new data) is supplied to the gate electrode of the transistor 160 and to the capacitor 164. After that, the potential of the fourth wiring is set to a potential at which the transistor 162 is turned off, so that the transistor 162 is turned off. Accordingly, charge for new data is supplied to the gate electrode of the transistor 160.

In the semiconductor device according to the disclosed invention, data can be directly rewritten by another writing of data as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the drain electrode (or the source electrode) of the transistor 162 is electrically connected to the gate electrode of the transistor 160 and therefore has a function similar to that of a floating gate of a floating gate transistor used for a nonvolatile memory element. A portion where the drain electrode (or the source electrode) of the transistor 162 is electrically connected to the gate electrode of the transistor 160 is called a node FG in some cases. When the transistor 162 is turned off, the node FG can be regarded as being embedded in an insulator and thus charge is held at the node FG. The off-state current of the transistor 162 including an oxide semiconductor is smaller than or equal to 1/100000 of the off-state current of a transistor including a silicon semiconductor or the like; thus, loss of the charge accumulated in the node FG due to leakage in the transistor 162 is negligible. That is, with the transistor 162 including an oxide semiconductor, a nonvolatile memory device which can hold data without being supplied with power can be realized.

For example, when the off-state current of the transistor 162 at room temperature (25° C.) is 10 zA (1 zA (zeptoampere) is $1 \times 10^{-21}$ A) or less and the capacitance of the capacitor 164 is approximately 10 fF, data can be held for $10^4$ seconds or longer. It is needless to say that the holding time depends on transistor characteristics and capacitance.

Further, the semiconductor device according to the disclosed invention does not have the problem of deterioration of a gate insulating film (tunnel insulating film), which has been a problem of a conventional floating gate transistor. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figures 1, 1A, 2:
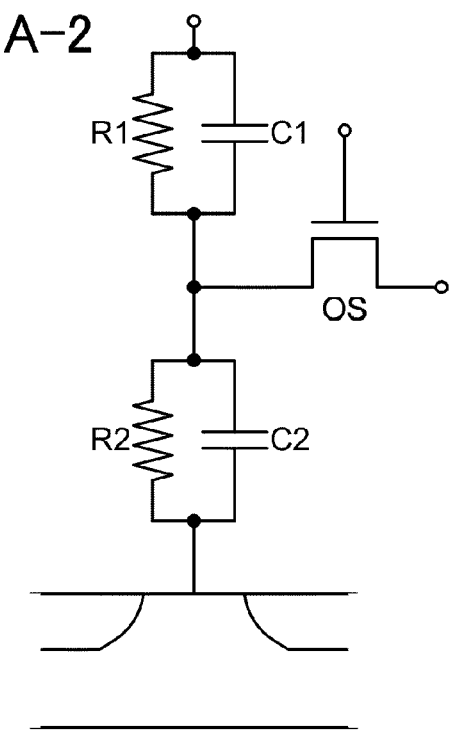

Components such as transistors in the semiconductor device in FIG. 1A-1 can be regarded as including resistors and capacitors as illustrated in FIG. 1A-2. That is, in FIG. 1A-2, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≧ROS (R1 is greater than or equal to ROS) and R2≧ROS (R2 is greater than or equal to ROS), where ROS is the resistance (also referred to as effective resistance) between the source electrode and the drain electrode in a state where the transistor 162 is turned off.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode of the transistor 160) is large. Accordingly, it can be said that the semiconductor device disclosed in this embodiment preferably satisfies the above relationships of R1≧ROS (R1 is greater than or equal to ROS) and R2≧ROS (R2 is greater than or equal to ROS).

Meanwhile, it is desirable that C1 and C2 satisfy C1≧C2 (C1 is greater than or equal to C2). This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates higher integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

In the case where the relative permittivity $\in$r1 of the insulating layer forming the capacitor 164 is different from the relative permittivity $\in$r2 of the gate insulating layer forming the transistor 160, it is easy to satisfy C1≧C2 (C1 is greater than or equal to C2) while satisfying 2·S2≧S1 (2·S2 is greater than or equal to S1), desirably S2≧S1 (S2 is greater than or equal to S1), where S1 is the area of the capacitor 164 and S2 is the area having the gate capacitance in transistor 160. Specifically, for example, a film including a high-k material such as hafnium oxide or a stack of a film including a high-k material such as hafnium oxide and a film including an oxide semiconductor is used for the insulating layer forming the capacitor 164 so that $\in$r1 can be set to 10 or more, preferably 15 or more, and silicon oxide is used for the gate insulating layer forming the transistor 160 so that 3≦$\in$r≦4 ($\in$r2 is greater than or equal to 3 and less than or equal to 4).

A combination of such structures enables further higher integration of the semiconductor device according to the disclosed invention.

Note that in addition to higher integration, a multilevel technique can be employed in order to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q to the gate electrode of the transistor 160, in addition to charge $Q_L$ providing a low potential and charge $Q_H$ providing a high potential. In this case, enough storage capacity can be ensured even in a circuit structure with a relatively large scale (e.g., 15 $F^2$ to 50 $F^2$; F is the minimum feature size).

Application Example 1

Next, a more specific circuit structure to which the circuit illustrated in FIGS. 1A-1, 1A-2, and 1B is applied and an operation thereof will be described with reference to FIGS. 2A and 2B, FIG. 3, FIG. 4, FIGS. 5A and 5B, and FIGS. 6A to 6D.

Figure 2A:
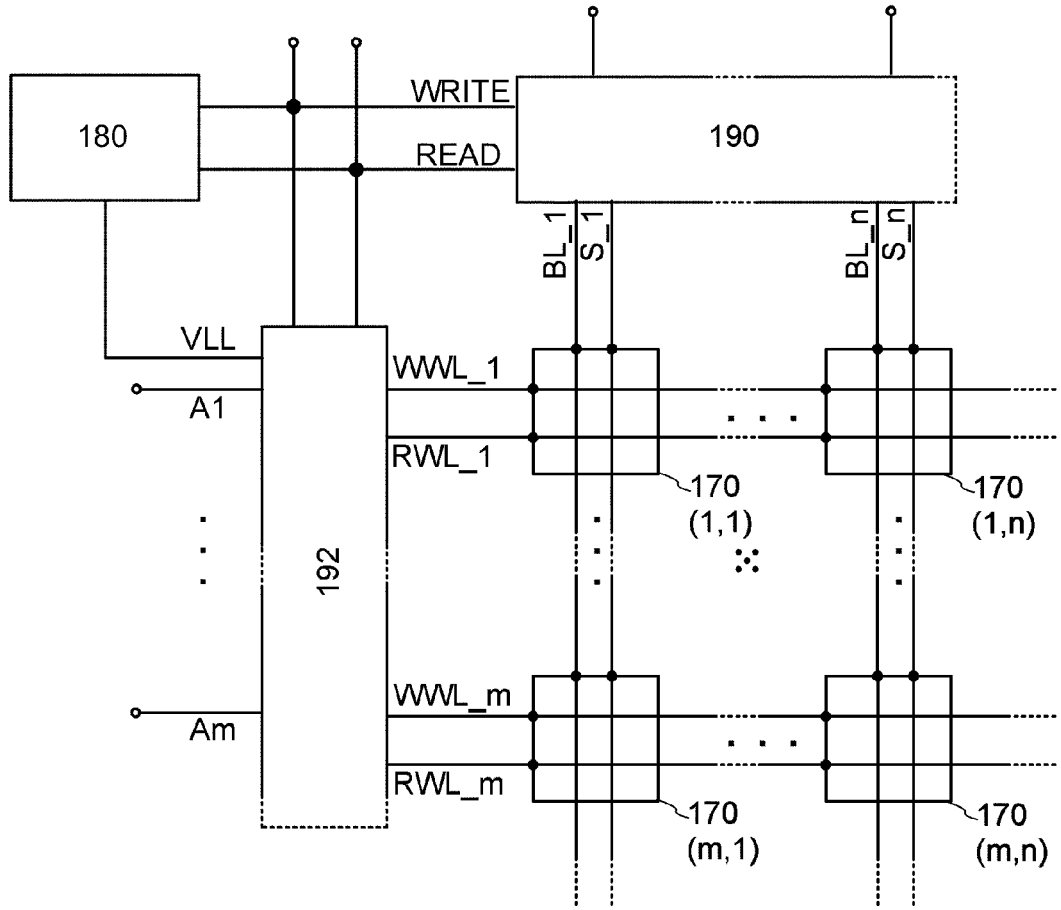
FIGS. 2A and 2B are circuit diagrams of a semiconductor device.
Figure 2B:
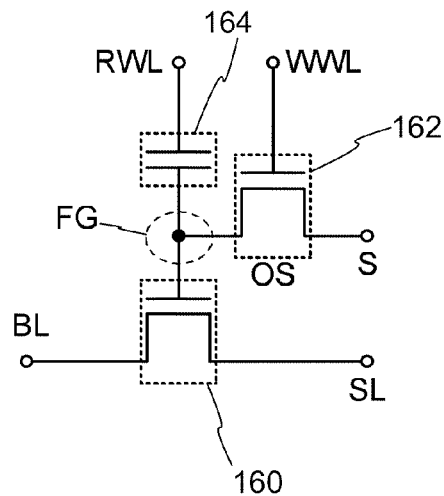

FIGS. 2A and 2B are an example of a circuit diagram of a semiconductor device including (m×n) memory cells 170. The structure of the memory cells 170 in FIGS. 2A and 2B is similar to that in FIG. 1A-1. That is, the second wiring in FIG. 1A-1 corresponds to a bit line BL in FIG. 2B; the third wiring in FIG. 1A-1, a signal line S in FIG. 2B; the fourth wiring in FIG. 1A-1, a write word line WWL in FIG. 2B; and the fifth wiring in FIG. 1A-1, a read word line RWL in FIG. 2B. Note that in FIG. 2A, a source line which is the first wiring in FIG. 1A-1 is omitted in FIG. 2A.

The semiconductor device in FIG. 2A includes m (m is an integer greater than or equal to 2) write word lines WWL, m read word lines RWL, n (n is an integer greater than or equal to 2) bit lines BL, n signal lines S, a memory cell array having memory cells 170 arranged in a matrix of m (rows) (in the vertical direction)×n (columns) (in the horizontal direction), a potential conversion circuit 180, a first driver circuit 190 connected to the n bit lines BL and the n signal lines S, and a second driver circuit 192 connected to the m write word lines WWL and the m read word lines RWL. Here, the potential conversion circuit 180 is connected to the second driver circuit 192 through a wiring VLL and outputs a potential (a low potential: VL) lower than a reference potential (e.g., a ground potential GND) to the second driver circuit 192. Note that although the structure in which a wiring WRITE and a wiring READ are connected to the potential conversion circuit 180 is employed in this embodiment so as to convert output potentials of the second driver circuit 192 to WWL and RWL in accordance with the output of the first driver circuit 190, the disclosed invention is not limited to this structure. A structure in which the potential conversion circuit 180, the first driver circuit 190, and the second driver circuit 192 are not connected by the wiring WRITE and the wiring READ may be employed.

In addition, address selection signal lines A are connected to the second driver circuit 192. The address selection signal lines A are wirings which transmit a signal for selecting a row address of memory cells.

Figure 24:
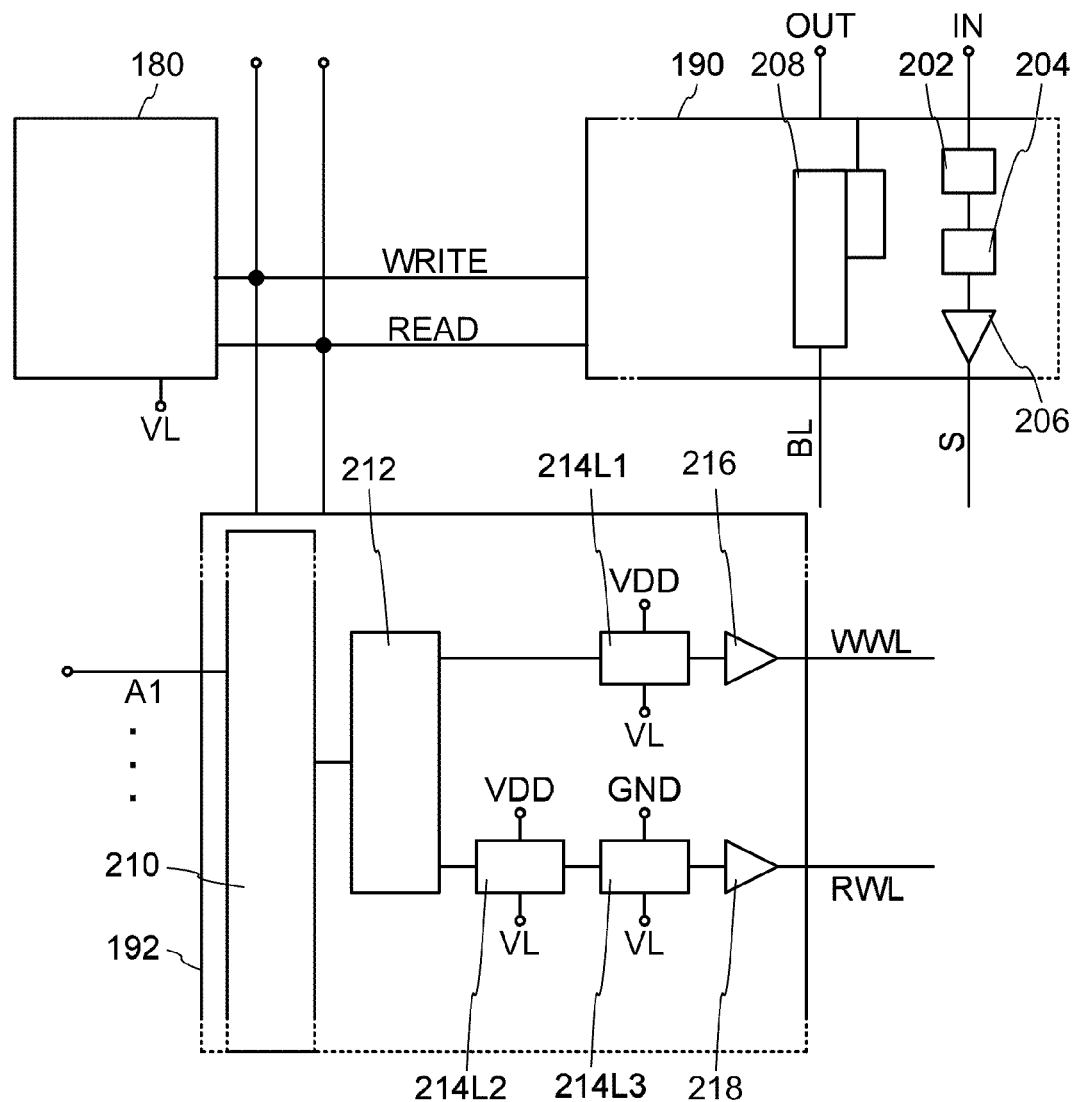
FIG. 24 is a circuit diagram of a semiconductor device.

FIG. 24 illustrates an example of specific structures of the first driver circuit 190 and the second driver circuit 192 of the semiconductor device illustrated in FIGS. 2A and 2B. Note that the structures of the first driver circuit 190 and the second driver circuit 192 are not limited to this example.

In FIG. 24, the first driver circuit 190 includes a control circuit 202 connected to an input terminal from which a signal is input to the control circuit, a delay circuit 204 connected to the control circuit 202, a buffer circuit 206 connected to the delay circuit 204 and the signal line S, a reading circuit 208 connected to the bit line, and an output terminal from which a signal from the reading circuit is output.

In addition, in FIG. 24, the second driver circuit 192 includes a decoder 210 connected to the address selection signal line A, a control circuit 212 connected to the decoder 210, step-down level shifters 214L1, 214L2, and 214L3 connected to the control circuit 212, a buffer circuit 216 connected to the write word line WWL, and a buffer circuit 218 connected to the read word line RWL. The step-down level shifters 214L1, 214L2, and 214L3 included in the second driver circuit 192 convert the amplitude of a signal with the use of the potential VL converted in the potential conversion circuit 180. Here, VL or VDD is output to the write word line WWL, and VL or GND is output to the read word line RWL.

Data writing, holding, and reading in the semiconductor device illustrated in FIGS. 2A and 2B are basically similar to the case of FIGS. 1A-1, 1A-2, and 1B. A specific writing operation is described below. Note that although the case where either a potential V1 (a potential lower than a power supply potential VDD) or a ground potential GND is supplied to the node FG is described here as an example, the relationship among potentials supplied to the node FG is not limited to this example. Data that is held when the potential V1 is supplied to the node FG is referred to as data "1", and data that is held when the ground potential GND is supplied to the node FG is referred to as data "0".

First, for data writing, the memory cell 170 that is a target for writing is selected by setting the potentials of the read word line RWL and the write word line WWL, which are connected to the memory cell 170 that is the target for writing, to GND and VDD, respectively.

In the case of writing data "0" to the memory cell 170, GND is supplied to the signal line S. In the case of writing data "1" to the memory cell 170, a potential higher than that for data "1" by the threshold voltage of the transistor 162 is supplied to the signal line S in consideration of a potential decrease in the transistor 162 by its threshold voltage.

Data is held by setting the potential of the read word line RWL and the potential of the write word line WWL to the potential VL lower than 0 V or GND (e.g., a potential lower than GND by VDD).

When the potential of the read word line RWL is decreased to VL from GND, the potential of the node FG is decreased by GND−VL (GND−VL=VDD) by capacitive coupling with the capacitor 164. Therefore, when V1 for data "1" is supplied to the node FG, the potential of the node FG is decreased by GND−VL (GND−VL=VDD) to V1−(GND−VL)(V1−(GND−VL)=V1−VDD). When GND for data "0" is supplied to the node FG, the potential of the node FG is decreased by GND−VL (GND−VL=VDD) to VL.

Because VL is supplied to the write word line WWL, the transistor 162 is turned off regardless of whether data "1" or data "0" is written. Because the off-state current of the transistor 162 is significantly small, the charge of the gate electrode of the transistor 160 is held for a long time.

Data is read by setting the potentials of the read word lines RWL and the write word lines WWL to GND and VL, respectively.

When the potential of the read word line RWL is increased to GND from VL, the potential of the node FG is increased by GND−VL (=VDD) by capacitive coupling with the capacitor 164. Therefore, when V1 for data "1" is supplied to the node FG, the potential of the node FG is increased by GND−VL (GND−VL=VDD) to V1, and when GND for data "0" is supplied to the node FG, the potential of the node FG is increased by GND−VL (GND−VL=VDD) to GND.

By the above reading operation, if data "1" is written to the memory cell 170, the transistor 160 is turned on and the potential of the bit line BL is decreased. If data "0" is written, the transistor 160 is turned off and the potential of the bit line BL is maintained at the level at the beginning of reading or is raised.

Figure 4:
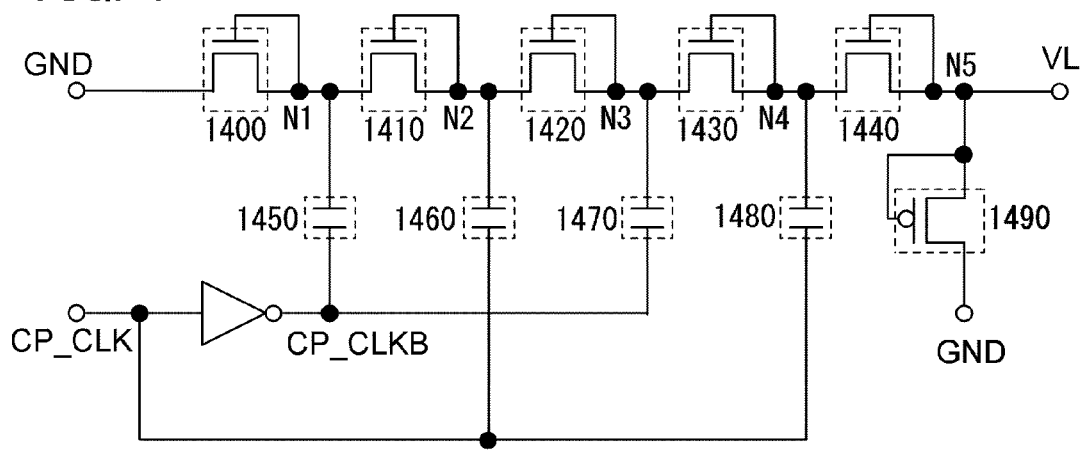
FIG. 4 is a circuit diagram of a semiconductor device.

As an example of the potential conversion circuit 180, a step-down circuit can be used. An example of a four-stage step-down circuit is illustrated in FIG. 4. In FIG. 4, a ground potential GND is supplied to an input terminal (here, referring to a source terminal or a drain terminal which is not connected to a gate terminal) of a first transistor 1400. An output terminal (here, referring to the source terminal or the drain terminal which is connected to the gate terminal) of the first transistor 1400 is connected to an input terminal of a second transistor 1410 and one terminal of a first capacitor 1450. Similarly, an output terminal of the second transistor 1410 is connected to an input terminal of a third transistor 1420 and one terminal of a second capacitor 1460. Connections in the following stages are similar to the above, and therefore, detailed explanation is omitted. However, the connection can be represented as follows: an output terminal of an n-th transistor is connected to one terminal of an n-th capacitor (n: a natural number). In FIG. 4, an output terminal of a transistor of the last stage is connected to a transistor 1490 that is connected to a ground potential GND; however, the disclosed invention is not limited to this structure. For example, a structure in which a capacitor connected to a ground potential GND is additionally provided may be employed. Note that in FIG. 4, an output of a fifth transistor 1440 is an output VL of the step-down circuit.

In addition, a clock signal CP_CLK is input to the other terminal of the second capacitor 1460 and the other terminal of a fourth capacitor 1480. An inverted clock signal CP_CLKB obtained by inverting the clock signal CP_CLK is input to the other terminal of the first capacitor 1450 and the other terminal of a third capacitor 1470. That is, the clock signal CP_CLK is input to the other terminal of a 2k-th capacitor and the inverted clock signal CP_CLKB is input to the other terminal of a (2k−1)-th capacitor (k: a natural number). It is needless to say that the clock signal CP_CLK and the inverted clock signal CP_CLKB can be interchanged.

When the clock signal CP_CLK is low, that is, when the inverted clock signal CP_CLKB is high, the potential of the node N1 is temporarily raised by capacitive coupling with the first capacitor 1450, which causes the first transistor 1400 to be turned on and the voltage of the node N1 to be gradually decreased. After the voltage of the node N1 is dropped to a predetermined voltage (a voltage approximately equal to GND), the first transistor 1400 is turned off and the node N1 is in a floating state.

Next, the clock signal CP_CLK is high (in other words, the inverted clock signal CP_CLKB is low), the first transistor 1400 remains off, and the voltage applied to the other electrode of the first capacitor 1450 is changed. Thus, the voltage of the node N1 is dropped by a difference between high and low potentials of the clock signal CP_CLK.

Furthermore, by a drop of the voltage of the node N1, the second transistor 1410 is turned on and the voltage of the node N2 is dropped to a voltage which is approximately equal to the voltage of the node N1. After the voltage of the node N2 is dropped to a predetermined voltage, the second transistor 1410 is turned off and the node N2 is in a floating state.

Next, the clock signal CP_CLK is low (in other words, the inverted clock signal CP_CLKB is high), the second transistor 1410 remains off, and the voltage applied to the other electrode of the second capacitor 1460 is changed. Thus, the voltage of the node N2 is dropped by a difference between high and low potentials of the clock signal CP_CLK.

Furthermore, by a drop of the voltage of the node N2, the third transistor 1420 is turned on, and the voltage of the node N3 is dropped to a voltage which is approximately equal to the voltage of the node N2. After the voltage of the node N3 is dropped to a predetermined voltage, the third transistor 1420 is turned off and the node N3 is in a floating state.

Furthermore, the fourth and fifth transistors and capacitors, which follow the third transistor and capacitor, sequentially operate in a manner similar to the above transistors and capacitors as the clock signal CP_CLK or the inverted clock signal CP_CLKB periodically becomes high or low. The voltage of each of the nodes is gradually dropped. In this manner, the step-down circuit illustrated in FIG. 4 can drop a voltage from GND to VL. Note that the step-down circuit is not limited to a four-stage step-down circuit. The number of stages of the step-down circuit can be changed as appropriate.

Note that with the use of a transistor including an oxide semiconductor with favorable off-state current characteristics as a transistor included in the step-down circuit, the voltage of each node can be held for a longer time.

In addition, a signal whose amplitude is converted by the level shifters (step-down level shift circuits) included in the second driver circuit 192 with the use of a potential converted in the potential conversion circuit 180 is output to the memory cells 170 through the read word line RWL.

Figure 5A:
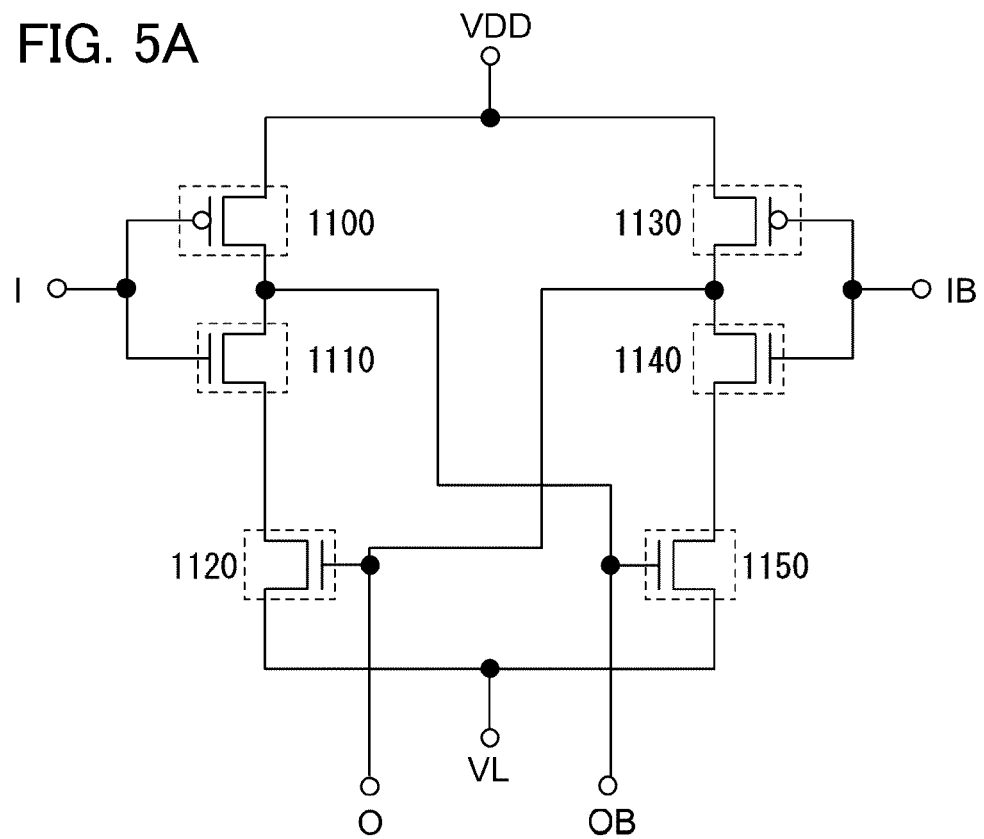
FIGS. 5A and 5B are circuit diagrams of a semiconductor device.
Figure 5B:
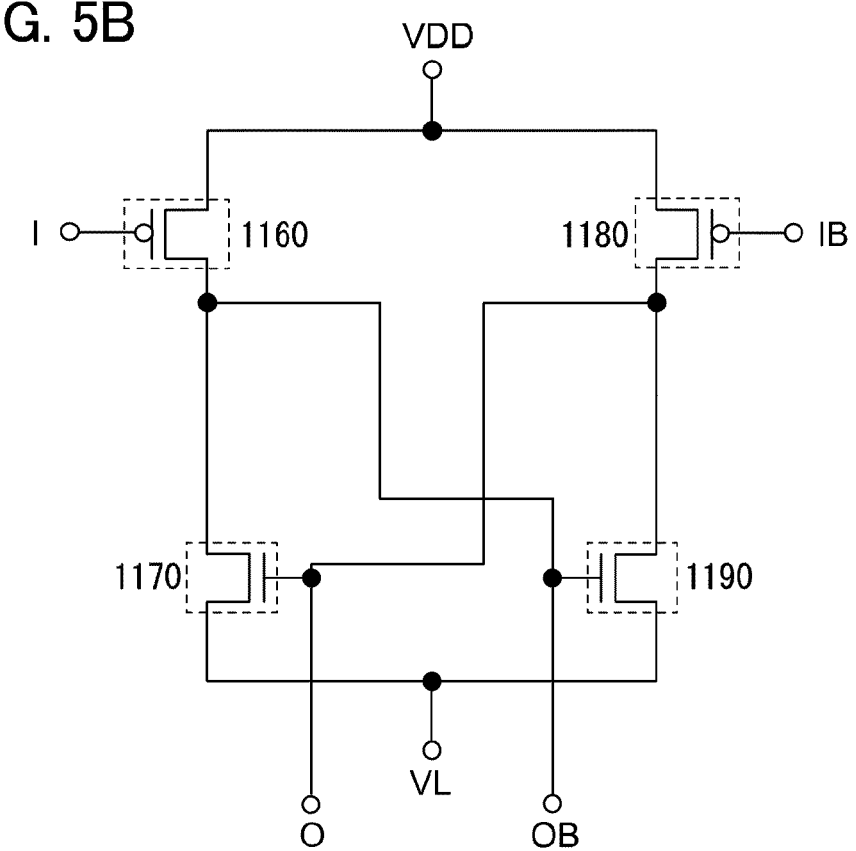

FIGS. 5A and 5B each illustrate an example of a diagram of a step-down level shift circuit. The level shifter illustrated in FIG. 5A has the following structure. A source terminal of a first p-type transistor 1100 and a source terminal of a second p-type transistor 1130 are both electrically connected to a power source which supplies a potential VDD. A drain terminal of the first p-type transistor 1100 is electrically connected to a drain terminal of a first n-type transistor 1110 and a gate terminal of a fourth n-type transistor 1150. A drain terminal of the second p-type transistor 1130 is electrically connected to a drain terminal of a third n-type transistor 1140 and a gate terminal of a second n-type transistor 1120. A source terminal of the second n-type transistor 1120 and a source terminal of the fourth n-type transistor 1150 are both electrically connected to a power source which supplies a potential VL.

In FIG. 5A, an input signal (I) is input to a gate terminal of the first p-type transistor 1100 and a gate terminal of the first n-type transistor 1110, and an inverted signal (IB) of the input signal is input to a gate terminal of the second p-type transistor 1130 and a gate terminal of the third n-type transistor 1140. An output signal (O) is taken out from the gate terminal side of the second n-type transistor 1120. In addition, an inverted signal (OB) of the output signal can be taken out from the gate terminal side of the fourth n-type transistor 1150.

A basic operation of the level shifter illustrated in FIG. 5A will be described. When the input signal (I) is high, the first p-type transistor 1100 is turned off and the first n-type transistor 1110 is turned on. On the other hand, at that time, the inverted signal (IB) of the input signal is low. Thus, the second p-type transistor 1130 is turned on and the potential VDD is input to the gate terminal of the second n-type transistor 1120. Thus, the second n-type transistor 1120 is turned on and the output signal (O) is high. At that time, the potential is VDD. In addition, both the second n-type transistor 1120 and the first n-type transistor 1110 are turned on. Thus, the potential VL is input to the gate terminal of the fourth n-type transistor 1150 and the inverted signal (OB) of the output signal is low. At that time, the potential is VL.

When the potential of the input signal (I) is low, the transistors of the level shifter illustrated in FIG. 5A operate in a manner opposite to the above; the output signal (O) is low, and at that time, the potential is VL.

In this manner, the output signal (O) whose amplitude is converted with respect to the input signal can be obtained. In other words, the level shifter illustrated in FIG. 5A can convert the difference between high and low potentials of the input signal (I) into the difference between high and low potentials of the output signal (O).

FIG. 5B illustrates an example of a circuit diagram of a step-down level shift circuit which is different from that in FIG. 5A. A structure of the level shifter illustrated in FIG. 5B is as follows. A source terminal of a first p-type transistor 1160 and a source terminal of a second p-type transistor 1180 are both electrically connected to a power source which supplies a potential VDD. A drain terminal of the first p-type transistor 1160 is electrically connected to a drain terminal of a first n-type transistor 1170 and a gate terminal of a second n-type transistor 1190, and a drain terminal of the second p-type transistor 1180 is electrically connected to a drain terminal of the second n-type transistor 1190 and a gate terminal of the first n-type transistor 1170. IN addition, a source terminal of the first n-type transistor 1170 and a source terminal of the second n-type transistor 1190 are both electrically connected to a power source which supplies a potential VL.

In FIG. 5B, an input signal (I) is input to a gate terminal of the first p-type transistor 1160, and an inverted signal (IB) of the input signal is input to a gate terminal of the second p-type transistor 1180. An output signal (O) is taken out from the gate terminal side of the first n-type transistor 1170. In addition, an inverted signal (OB) of the output signal can be taken out from the gate terminal side of the second n-type transistor 1190.

A basic operation of the level shifter illustrated in FIG. 5B will be described. When the input signal (I) is high, the first p-type transistor 1160 is turned off, and on the other hand, because the inverted signal (IB) of the input signal is low at that time, the second p-type transistor 1180 is turned on. Therefore, the potential VDD is input to the gate terminal of the first n-type transistor 1170. Thus, the first n-type transistor 1170 is turned on and the output signal (O) is high. At that time, the potential is VDD. In addition, the first n-type transistor 1170 is turned on. Thus, the potential VL is input to the gate terminal of the second n-type transistor 1190 and the inverted signal (OB) of the output signal is low. At that time, the potential is VL.

When the potential of the input signal (I) is low, the transistors of the level shifter illustrated in FIG. 5B operate in a manner opposite to the above; the output signal (O) is low, and at that time, the potential is VL.

In this manner, the output signal (O) whose amplitude is converted with respect to the input signal can be obtained. In other words, the level shifter illustrated in FIG. 5B can convert the difference between high and low potentials of the input signal (I) into the difference between high and low potentials of the output signal (O).

Figure 3:
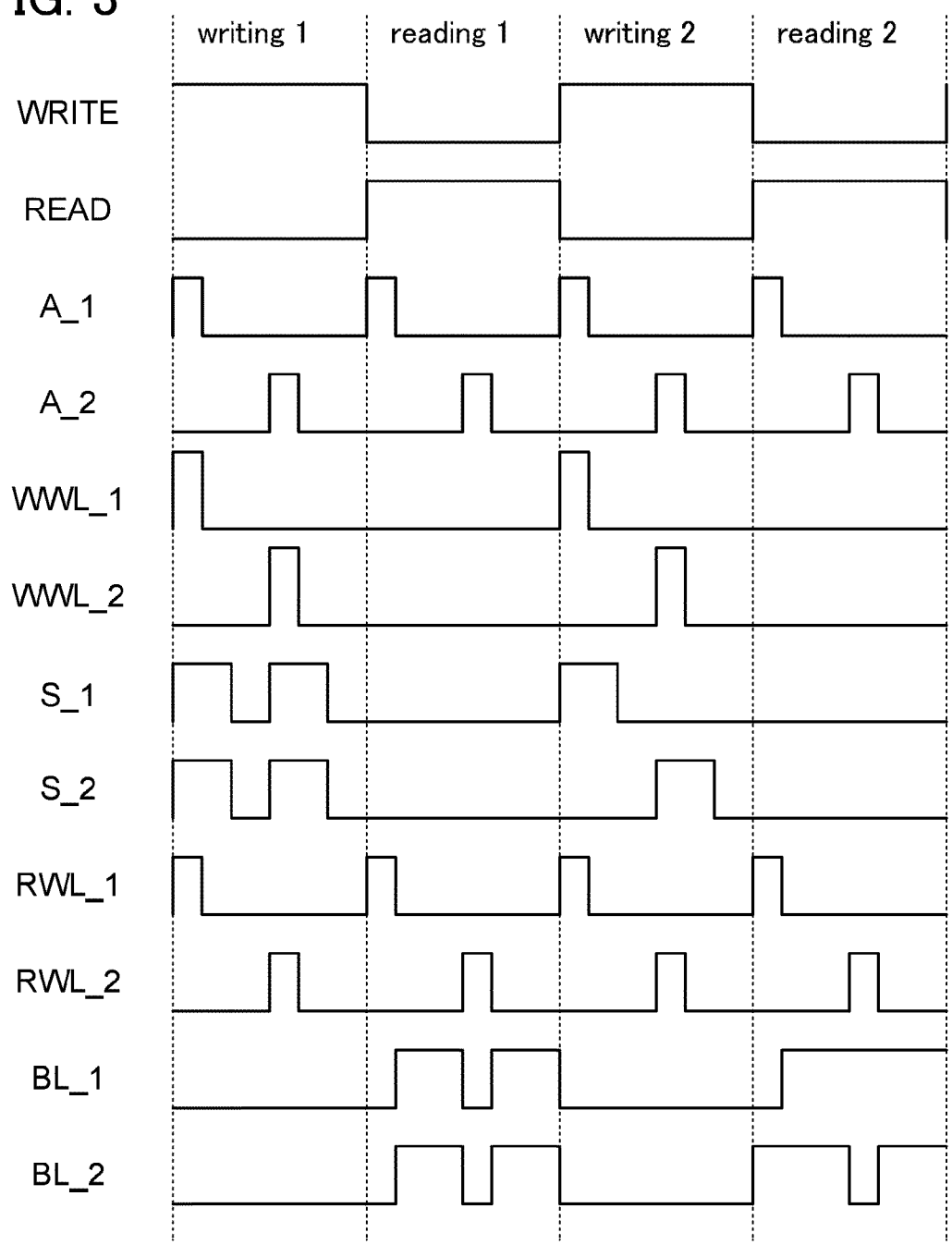
FIG. 3 is a timing chart.

FIG. 3 is an example of a timing chart for more detailed operations of the semiconductor device in FIGS. 2A and 2B. READ, A, and the like in the timing chart denote the lines to which the potentials in the timing chart are applied. Lines having a similar function are distinguished by "_1", "_2", and the like added to the end of their names. Note that for the sake of simplicity, the semiconductor device described here is an example where the memory cells 170 are arranged in 2 (rows)×2 (columns), but the disclosed invention is not limited to this example.

The timing chart in FIG. 3 shows the relationship among the potentials of the lines in the case where data "1" is written to all the memory cells (Writing 1), then the written data in all the memory cells is read out (Reading 1), then data "1" is written to the memory cells in the first row and the first column and in the second row and the second column while data "0" is written to the memory cells in the first row and the second column and in the second row and the first column (Writing 2), and then the written data in all the memory cells is read out (Reading 2).

In Writing 1, a condition where data can be written to the memory cells is produced by setting WRITE at a high potential and READ at a low potential. The second driver circuit 192 outputs a row selection signal to RWL and WWL in accordance with the potential of A. Here, in the case where A is at a high potential, a target row is selected. In addition, RWL and WWL of a row selected are set to a high potential.

In Writing 1, data "1" is written to all the memory cells; therefore, S_1 and S_2 are set to a high potential in accordance with the timing of row selection. Note that the period for signal input to S_1 and S_2 is set as long as or longer than the period for signal input to RWL and WWL. Alternatively, the signal input to S_1 and S_2 is delayed relative to the signal input to WWL. This is because there is a possibility that writing to memory cells may be insufficient if the period for signal input to S_1 and S_2 is short. In order to realize the operation, a delay circuit is connected to S_1 and S_2 and the signal input to S_1 and S_2 is delayed relative to the signal input to WWL, for example. Alternatively, the signal input to S_1 and S_2 is delayed relative to the signal input to WWL by setting the channel length of transistors of buffer circuits connected to S_1 and S_2 larger than the channel length of a transistor of the buffer circuit connected to WWL. Alternatively, the signal input to S_1 and S_2 is delayed relative to the signal input to WWL by setting the channel width of transistors of the buffer circuit connected to $S_1$ and S_2 smaller than the channel width of a transistor of the buffer circuit connected to WWL. Note that the potentials of BL_1 and BL_2 are not an issue at the time of writing (the potentials may be either a high potential or a low potential).

In Reading 1, a condition where data can be read from the memory cells is produced by setting READ at a high potential and WRITE at a low potential. The second driver circuit 192 outputs a row selection signal to RWL and WWL in accordance with the potential of A. Here, in the case where A is at a low potential, a signal for selecting the first row is output, and in the case where A is at a high potential, a signal for selecting the second row is output. In addition, RWL of a row selected is at a high potential, and WWL is at a low potential regardless of whether it is in a selected row or not.

By the above operation, potentials in accordance with data held by memory cells of a row selected are supplied to BL_1 and BL_2. Note that the potentials of S_1 and S_2 are not an issue at the time of reading.

The relationship among the potentials of the lines in Writing 2 is similar to that in Writing 1. Note that S_1 and S_2 are set to a high potential or a low potential in accordance with the timing of row selection in order to write data "1" to the memory cells in the first row and the first column and in the second row and the second column and in order to write data "0" to the memory cells in the first row and the second column and in the second row and the first column.

The relationship among the potentials of the lines in Reading 2 is similar to that in Reading 1. It is confirmed that the potential corresponding to the data held in the memory cells in the selected row is applied to the BL_1 and the BL_2.

Note that in order to delay the signal that is input to the signal line S relative to the signal that is input to the write word line WWL in the above writing operations, one of delay circuits illustrated in FIGS. 6A to 6D is preferably provided in the first driver circuit 190 and connected to the signal line S, for example. By connecting the delay circuit and the signal line S, a change in potential of the signal line S can be delayed relative to a change in potential of the write word line WWL, and errors in writing data to the memory cell 170 can be reduced.

Figure 6A:
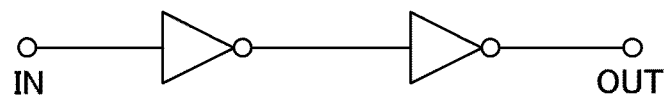
FIGS. 6A to 6D are circuit diagrams of a semiconductor device.
Figure 6B:
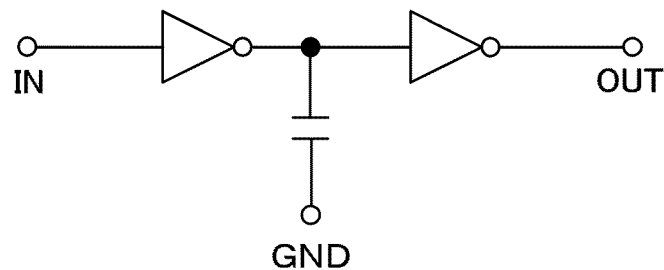
Figure 6C:
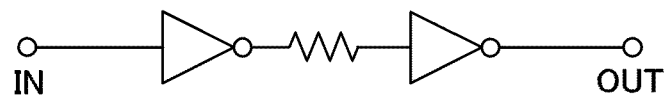
Figure 6D:
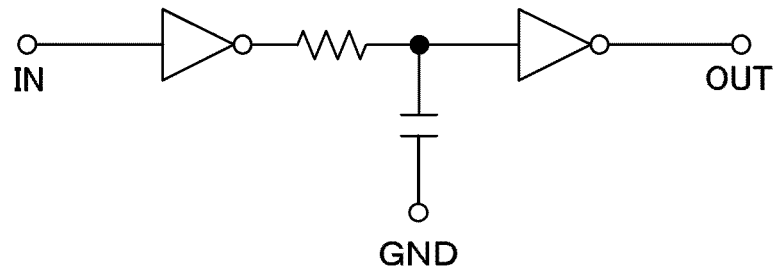

As an example of the delay circuit, a circuit in which an even number of inverters are connected in series as illustrated in FIG. 6A can be used. Alternatively, the delay circuit may have a structure in which a capacitor is added to an even number of inverters connected in series as illustrated in FIG. 6B or a structure in which a resistor is added to an even number of inverters connected in series as illustrated in FIG. 6C. Still alternatively, the delay circuit may have a structure in which a resistor and a capacitor are added to an even number of inverter circuits connected in series as illustrated in FIG. 6D.

Alternatively, in order to delay the signal that is input to the signal line S relative to the signal that is input to the write word line WWL in the above writing operations, than the channel length of a transistor of the buffer circuit included in the second driver circuit 192 may be set larger than the channel length of a transistor of the buffer circuit included in the first driver circuit 190. Alternatively, the channel width of a transistor of the buffer circuit included in the second driver circuit 192 may be set smaller than the channel width of a transistor of the buffer circuit included in the first driver circuit 190. Also in that case, a change in potential of the signal line S can be delayed relative to a change in potential of the write word line WWL, and errors in writing data to the memory cell 170 can be reduced.

The structures, methods, and the like described in this embodiment can be combined as appropriate with any of the structures, methods, and the like described in the other embodiments.

Application Example 2

A circuit structure which is different from the circuit structure illustrated in FIGS. 2A and 2B will be described with reference to FIGS. 7A and 7B, FIG. 8, and FIGS. 9A and 9B.

Figure 7A:
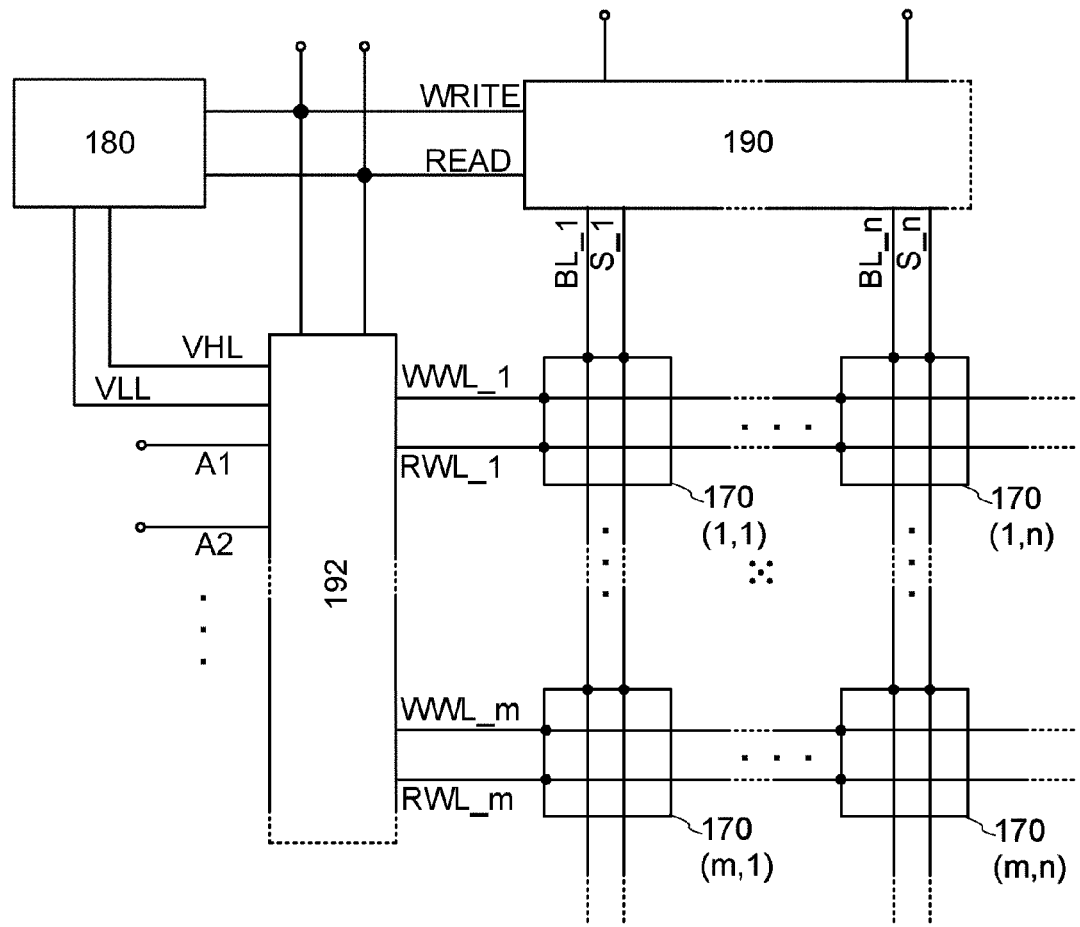
FIGS. 7A and 7B are circuit diagrams of a semiconductor device.
Figure 7B:
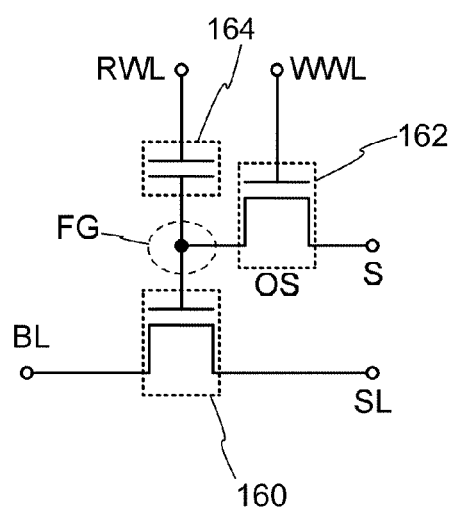

FIGS. 7A and 7B are an example of a circuit diagram of a semiconductor device including (m×n) memory cells 170. The structure of the memory cells 170 in FIG. 7A is similar to that in FIG. 2B; therefore, the detailed description thereof is omitted.

The semiconductor device in FIG. 7A includes m (m is an integer greater than or equal to 2) write word lines WWL, m read word lines RWL, n (n is an integer greater than or equal to 2) bit lines BL, n signal lines S, a memory cell array having the memory cells 170 arranged in a matrix of m (rows) (in the vertical direction)×n (columns) (in the horizontal direction), a potential conversion circuit 180, a first driver circuit 190 connected to the n bit lines BL and the n signal lines S, and a second driver circuit 192 connected to the m write word lines WWL and the m read word lines RWL. Here, the potential conversion circuit 180 is connected to the second driver circuit 192 through a wiring VLL and a wiring VHL and outputs a potential (a low potential: VL) lower than a ground potential GND and a potential (a high potential: VH) higher than a power supply potential to the second driver circuit 192. Note that although the structure in which a wiring WRITE and a wiring READ are connected to the potential conversion circuit 180 is employed in this embodiment so as to convert potentials output from the second driver circuit 192 to WWL and RWL in accordance with the output of the first driver circuit 190, the disclosed invention is not limited to this structure. A structure in which the potential conversion circuit 180, the first driver circuit 190, and the second driver circuit 192 are not connected by the wiring WRITE and the wiring READ may be employed.

In addition, address selection signal lines A are connected to the second driver circuit 192. The address selection signal lines A are wirings which transmit a signal for selecting a row address of memory cells.

Figure 25:
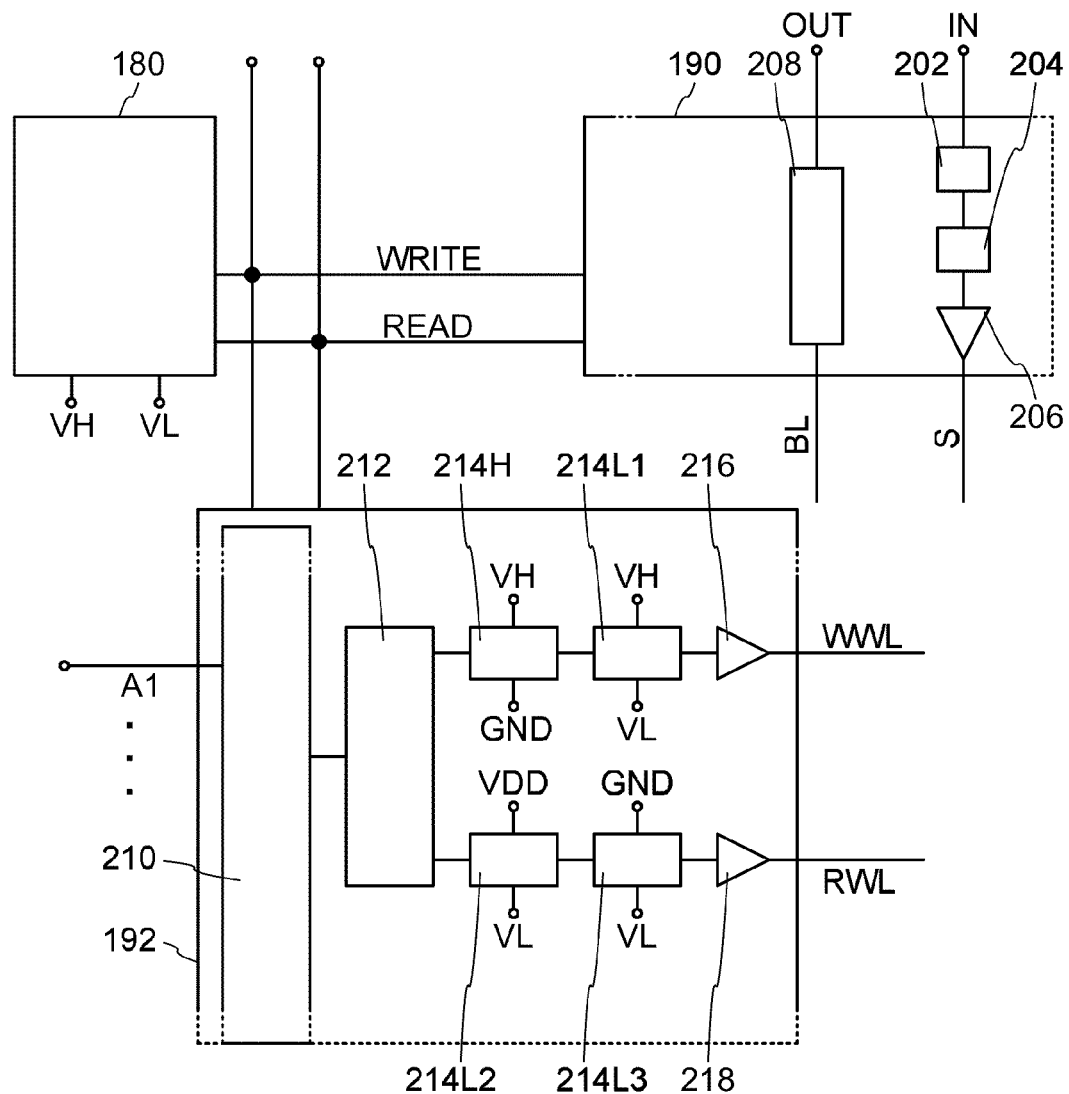
FIG. 25 is a circuit diagram of a semiconductor device.

FIG. 25 illustrates an example of specific structures of the first driver circuit 190 and the second driver circuit 192 of the semiconductor device illustrated in FIGS. 7A and 7B. Note that the structures of the first driver circuit 190 and the second driver circuit 192 are not limited to this example.

In FIG. 25, the first driver circuit 190 includes a control circuit 202 connected to an input terminal from which a signal is input to the control circuit, a delay circuit 204 connected to the control circuit 202, a buffer circuit 206 connected to the delay circuit 204 and the signal line S, a reading circuit 208 connected to the bit line, and an output terminal from which a signal from the reading circuit is output.

In addition, in FIG. 25, the second driver circuit 192 includes a decoder 210 connected to the address selection signal line A, a control circuit 212 connected to the decoder 210, step-down level shifters 214L1, 214L2, and 214L3 (also referred to as a step-down level shift circuit) and a step-up level shifter 214H connected to the control circuit 212, a buffer circuit 216 connected to the write word line WWL, and a buffer circuit 218 connected to the read word line RWL. The step-down level shifters 214L1, 214L2, and 214L3 and the step-up level shifter 214H included in the second driver circuit 192 convert the amplitude of a signal with the use of the potential VL or the potential VH converted in the potential conversion circuit 180. Here, VL or VH is output to the write word line WWL, and VL or GND is output to the read word line RWL.

Data writing, holding, and reading in the semiconductor device illustrated in FIGS. 7A and 7B are similar to the case of FIGS. 2A and 2B. Note that in the structure illustrated in FIGS. 7A and 7B, the potential of the write word line WWL can be set at a potential (VH) higher than a power supply potential at the time of data writing. Therefore, a sufficiently high potential (e.g., VDD) can be supplied to the node FG, and data can be held for a longer time. In addition, data discrimination capability can be improved.

Figure 8:
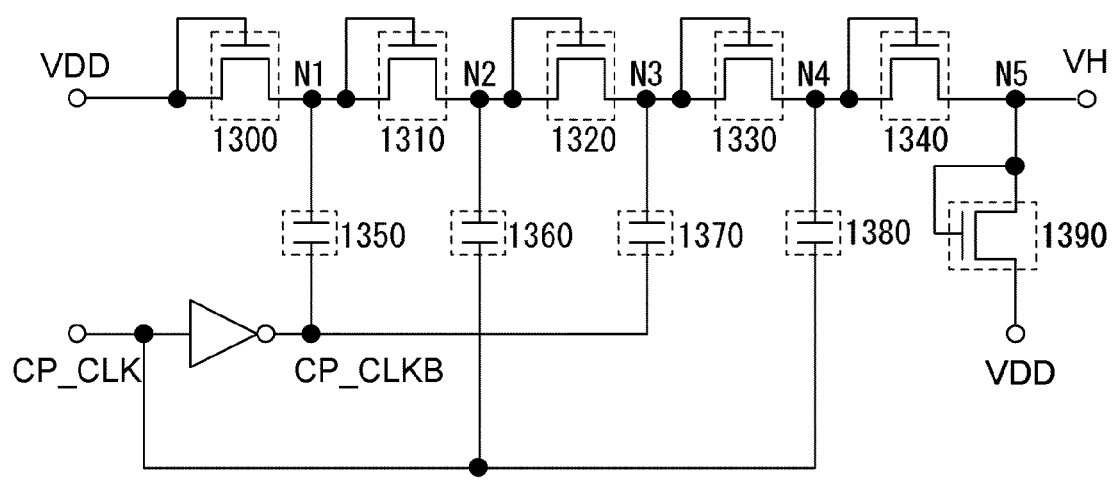
FIG. 8 is a circuit diagram of a semiconductor device.

For the potential conversion circuit 180, a combination of the step-down circuit illustrated in FIG. 4 as an example and a step-up circuit can be used. An example of a four-stage step-up circuit is illustrated in FIG. 8. In FIG. 8, a power supply potential VDD is supplied to an input terminal (here, referring to a source terminal or a drain terminal which is connected to a gate terminal) of a first transistor 1300. An output terminal (here, referring to the source terminal or the drain terminal which is not connected to the gate terminal) of the first transistor 1300 is connected to an input terminal of a second transistor 1310 and one terminal of a first capacitor 1350. Similarly, an output terminal of the second transistor 1310 is connected to an input terminal of a third transistor 1320 and one terminal of a second capacitor 1360. Connections in the following stages are similar to the above, and therefore, detailed explanation is omitted. However, the connection can be represented as follows: an output terminal of an n-th transistor is connected to one terminal of an n-th capacitor (n: a natural number). In FIG. 8, an output terminal of a transistor of the last stage is connected to a transistor 1390 that is connected to a power source VDD; however, the disclosed invention is not limited to this structure. For example, a structure in which a capacitor connected to a ground potential GND is additionally provided may be employed. Note that in FIG. 8, an output of a fifth transistor 1340 is an output VH of the step-up circuit.

In addition, a clock signal CP_CLK is input to the other terminal of the second capacitor 1360 and the other terminal of a fourth capacitor 1380. A clock signal CP_CLKB obtained by inverting the clock signal CP_CLK is input to the other terminal of the first capacitor 1350 and the other terminal of a third capacitor 1370. That is, the clock signal CP_CLK is input to the other terminal of a 2k-th capacitor and the inverted clock signal CP_CLKB is input to the other terminal of a (2k−1)-th capacitor (k: a natural number). It is needless to say that the clock signal CP_CLK and the inverted clock signal CP_CLKB can be interchanged.

When the clock signal CP_CLK is low, that is, when the inverted clock signal CP_CLKB is high, the first capacitor 1350 and the third capacitor 1370 are charged, and potentials of a node N1 and a node N3 which are capacitively coupled with the inverted clock signal CP_CLKB are raised by a predetermined voltage (a voltage corresponding to a difference between high and low potentials of the clock signal CP_CLK). On the other hand, potentials of a node N2 and a node N4 which are capacitively coupled with the clock signal CP_CLK are dropped by a predetermined voltage.

Accordingly, charge is transferred through the second transistor 1310 and the fourth transistor 1330, and the potentials of the node N2 and the node N4 are raised to a predetermined value.

Next, when the clock signal CP_CLK becomes high and the inverted clock signal CP_CLKB becomes low, the potentials of the node N2 and the node N4 are further raised. On the other hand, the potentials of the node N1, the node N3, and a node N5 are dropped by a predetermined voltage.

Accordingly, charge is transferred through the first transistor 1300, the third transistor 1320, and the fifth transistor 1340, and as a result, the potentials of the node N3 and the node N5 are raised to a predetermined potential. Thus, the potentials of the nodes satisfy $V_{N5} > V_{N4(CP\_CLK=Low)} > V_{N3(CP\_CLK=High)} > V_{N2(CP\_CLK=Low)} > V_{N1(CP\_CLK=High)} > VDD$, whereby step-up is performed. Note that the step-up circuit is not limited to a four-stage step-up circuit. The number of stages of the step-up circuit can be changed as appropriate.

Note that with the use of a transistor including an oxide semiconductor with favorable off-state current characteristics as a transistor included in the step-up circuit, the voltage of each node can be held for a longer time.

A signal whose amplitude is converted by the step-down level shifters included in the second driver circuit 192 with the use of a low potential converted in the potential conversion circuit 180 is output to the memory cells 170 through the read word line RWL. In addition, a signal whose amplitude is converted by the step-up level shifter included in the second driver circuit 192 with the use of a high potential converted in the potential conversion circuit 180 is output to the memory cells 170 through the write word line WWL. Furthermore, a structure in which a signal whose amplitude is converted by a step-up level shifter included in the first driver circuit 190 with the use of a high potential converted in the potential conversion circuit 180 is output to the memory cells 170 through the signal line S may be employed. As the step-down level shifters, the structure illustrated in FIG. 5A or 5B can be employed.

Figure 9A:
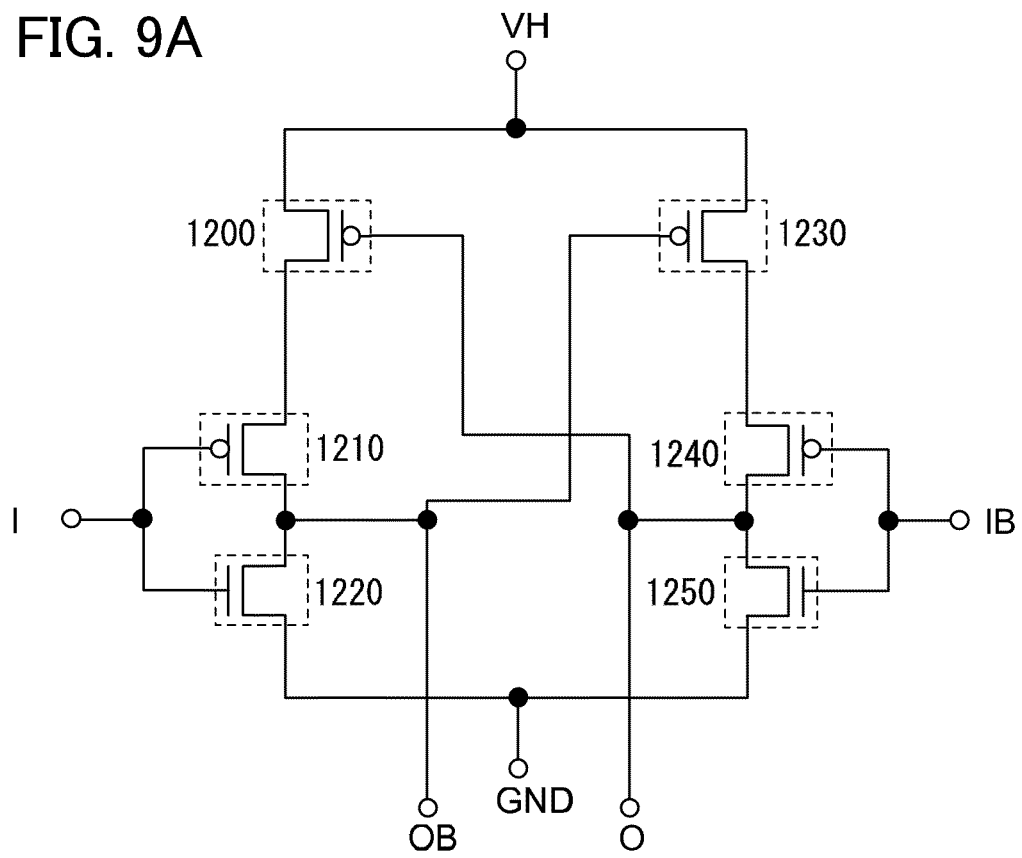
FIGS. 9A and 9B are circuit diagrams of a semiconductor device.
Figure 9B:
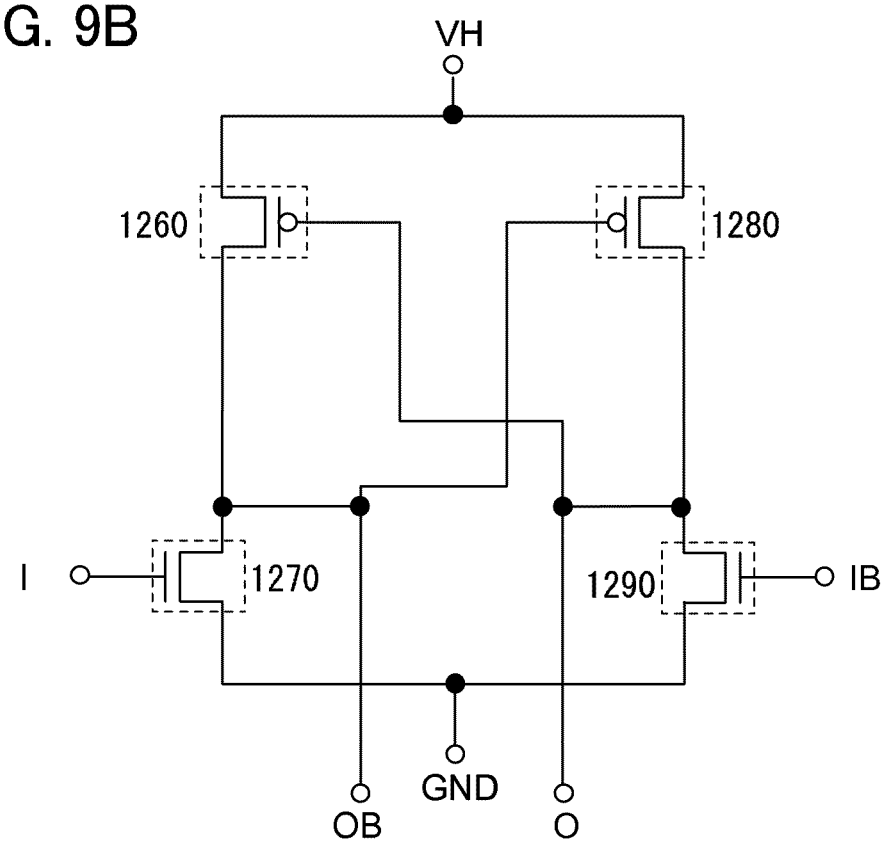

FIGS. 9A and 9B each illustrate an example of a diagram of a step-up level shift circuit. The level shifter illustrated in FIG. 9A has the following structure. A source terminal of a first p-type transistor 1200 and a source terminal of a third p-type transistor 1230 are both electrically connected to a power source which supplies a potential VH. A drain terminal of the first p-type transistor 1200 is electrically connected to a source terminal of a second p-type transistor 1210, and a drain terminal of the third p-type transistor 1230 is electrically connected to a source terminal of a fourth p-type transistor 1240. A drain terminal of the second p-type transistor 1210 is electrically connected to a drain terminal of a first n-type transistor 1220 and a gate terminal of the third p-type transistor 1230, and a drain terminal of the fourth p-type transistor 1240 is electrically connected to a drain terminal of a second n-type transistor 1250 and a gate terminal of the first p-type transistor 1200. GND (=0 V) is supplied to both a source terminal of the first n-type transistor 1220 and a source terminal of the second n-type transistor 1250.

In FIG. 9A, an input signal (I) is input to a gate terminal of the second p-type transistor 1210 and a gate terminal of the first n-type transistor 1220, and an inverted signal (IB) of the input signal is input to a gate terminal of the fourth p-type transistor 1240 and a gate terminal of the second n-type transistor 1250. An output signal (O) is taken out from the drain terminal of the fourth p-type transistor 1240. In addition, an inverted signal (OB) of the output signal can be taken out from the drain terminal of the second p-type transistor 1210.

A basic operation of the level shifter illustrated in FIG. 9A will be described. When the input signal (I) is high, the first n-type transistor 1220 is turned on. Thus, the potential GND is input to the gate terminal of the third p-type transistor 1230 and the third p-type transistor 1230 is turned on. In addition, the inverted signal (OB) of the output signal is low, and the potential at this time is GND. On the other hand, at that time, the inverted signal (IB) of the input signal is low. Thus, the fourth p-type transistor 1240 is turned on and the second n-type transistor 1250 is turned off. At that time, both the third p-type transistor 1230 and the fourth p-type transistor 1240 are turned on. Thus, the output signal (O) is high, and at that time, the potential is VH.

When the potential of the input signal (I) is low, the transistors of the level shifter illustrated in FIG. 9A operate in a manner opposite to the above; the output signal (O) is low, and at that time, the potential is GND.

In this manner, the output signal (O) whose amplitude is converted with respect to the input signal can be obtained. In other words, the level shifter illustrated in FIG. 9A can convert the difference between high and low potentials of the input signal (I) into the difference between high and low potentials of the output signal (O).

FIG. 9B illustrates an example of a circuit diagram of a step-up level shift circuit which is different from that in FIG. 9A. A structure of the level shifter illustrated in FIG. 9B is as follows. A source terminal of a first p-type transistor 1260 and a source terminal of a second p-type transistor 1280 are both electrically connected to a power source which supplies a potential VH. A drain terminal of a first n-type transistor 1270 is electrically connected to a drain terminal of the first p-type transistor 1260 and a gate terminal of the second p-type transistor 1280, and a drain terminal of a second n-type transistor 1290 is electrically connected to a drain terminal of the second p-type transistor 1280 and a gate terminal of the first p-type transistor 1260. GND (=0 V) is supplied to both a source terminal of the first n-type transistor 1270 and a source terminal of the second n-type transistor 1290.

In FIG. 9B, an input signal (I) is input to a gate terminal of the first n-type transistor 1270, and an inverted signal (IB) of the input signal is input to a gate terminal of the second n-type transistor 1290. An output signal (O) is taken out from the drain terminal of the second n-type transistor 1290. In addition, an inverted signal (OB) of the output signal can be taken out from the drain terminal of the first n-type transistor 1270.

A basic operation of the level shifter illustrated in FIG. 9B will be described. When the input signal (I) is high, the first n-type transistor 1270 is turned on. Thus, the potential GND is input to the gate terminal of the second p-type transistor 1280 and the second p-type transistor 1280 is turned on. In addition, the inverted signal (OB) of the output signal is low, and the potential at this time is GND. On the other hand, at that time, the inverted signal (IB) of the input signal is low. Thus, the second n-type transistor 1290 is turned off. At that time, the second p-type transistor 1280 is turned on. Thus, the output signal (O) is high, and at that time, the potential is VH.

When the potential of the input signal (I) is low, the level shifter illustrated in FIG. 9B operate in a manner opposite to the above; the output signal (O) is low, and at that time, the potential is GND.

In this manner, the output signal (O) whose amplitude is converted with respect to the input signal can be obtained. In other words, the level shifter illustrated in FIG. 9B can convert the difference between high and low potentials of the input signal (I) into the difference between high and low potentials of the output signal (O).

<Reading Circuit>

Next, an example of a reading circuit which can be used for the semiconductor devices illustrated in FIGS. 2A and 2B and FIGS. 7A and 7B and the like will be described with reference to FIGS. 23A to 23C.

Figure 23A:
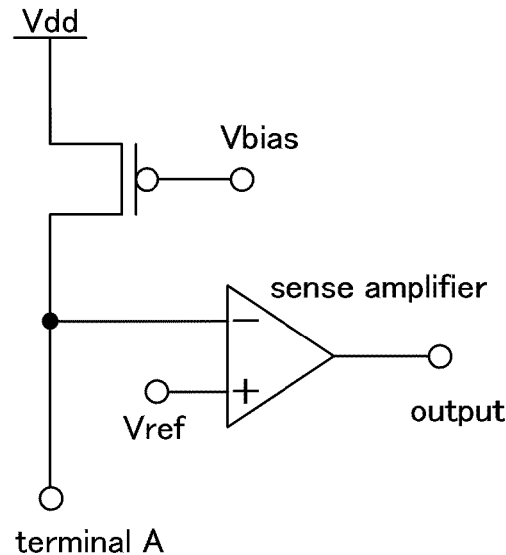
FIGS. 23A to 23C are circuit diagrams of a semiconductor device.

FIG. 23A illustrates an outline of the reading circuit. The reading circuit includes a transistor and a sense amplifier circuit.

At the time of reading data, a terminal A is connected to a bit line BL to which a memory cell from which data is to be read is connected. Further, a bias potential Vbias is applied to a gate electrode of the transistor so that a potential of the terminal A is controlled.

The resistance of the memory cell 170 varies depending on stored data. Specifically, when the transistor 160 of the memory cell 170 selected is turned on, the memory cell 170 has a low resistance, whereas when the transistor 160 of the memory cell 170 selected is turned off, the memory cell 170 has a high resistance.

When the memory cell has a high resistance, the potential of the terminal A is higher than a reference potential Vref and the sense amplifier circuit outputs a potential (data "0") corresponding to the potential of the terminal A. On the other hand, when the memory cell has a low resistance, the potential of the terminal A is lower than the reference potential Vref and the sense amplifier circuit outputs a potential (data "1") corresponding to the potential of the terminal A.

In this manner, by using the reading circuit, data can be read from the memory cell. Note that the reading circuit of this embodiment is one example. Another known circuit may be used. The reading circuit may further include a precharge circuit. Instead of the reference potential Vref, a bit line connected to a reference memory cell may be connected to the sense amplifier circuit.

Figure 23B:
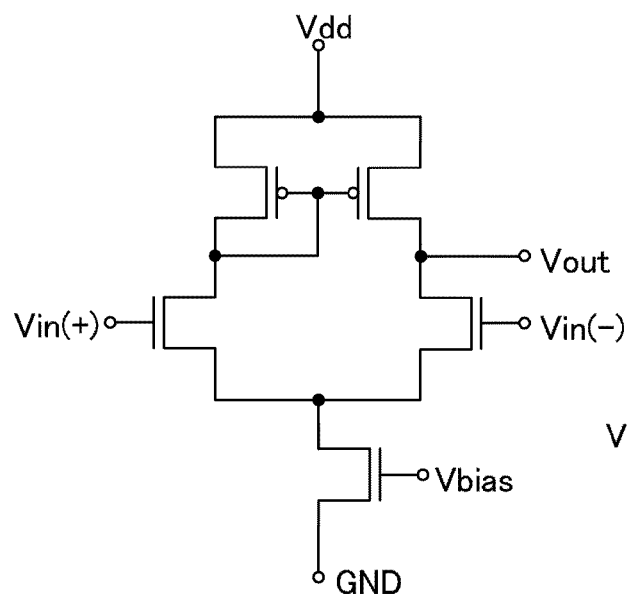

FIG. 23B illustrates a differential sense amplifier which is an example of sense amplifier circuits. The differential sense amplifier has input terminals Vin(+) and Vin(−) and an output terminal Vout, and amplifies a difference between Vin(+) and Vin(−). If Vin(+)>Vin(−), the output from Vout is relatively high, whereas if Vin(+)<Vin(−), the output from Vout is relatively low.

Figure 23C:
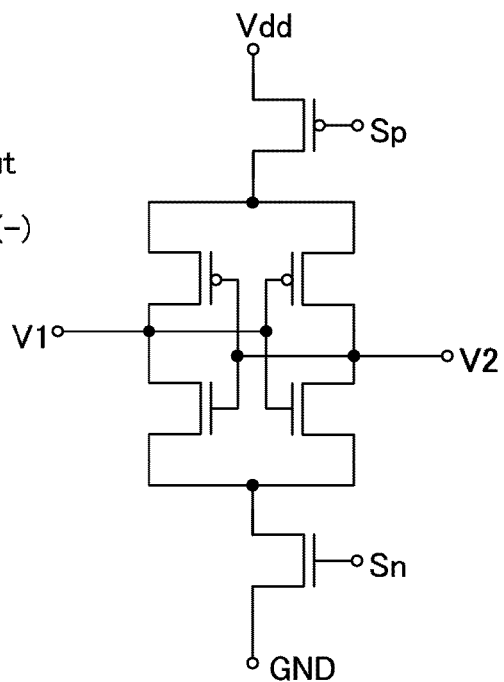

FIG. 23C illustrates a latch sense amplifier which is an example of sense amplifier circuits. The latch sense amplifier has input/output terminals V1 and V2 and input terminals for control signals Sp and Sn. First, the signal Sp is set high and the signal Sn is set low, and a power supply potential (Vdd) is interrupted. Then, potentials to be compared are supplied to V1 and V2. After that, the signal Sp is set low and the signal Sn is set high, and the power supply potential (Vdd) is supplied. If the potentials V1in and V2in to be compared satisfy V1in>V2in, the output from V1 is high and the output from V2 is low, whereas if the potentials satisfy V1in<V2in, the output from V1 is low and the output from V2 is high. By utilizing such a relationship, the difference between V1in and V2in can be amplified.

The structures, methods, and the like described in this embodiment can be combined as appropriate with any of the structures, methods, and the like described in the other embodiments.

Embodiment 2

In this embodiment, a structure and a manufacturing method of a semiconductor device according to one embodiment of the disclosed invention will be described with reference to FIGS. 10A and 10B, FIGS. 11A to 11D, FIGS. 12A to 12C, FIGS. 13A to 13D, and FIGS. 14A to 14C.

<Cross-Sectional Structure and Planar Structure of Semiconductor Device>

Figure 10A:
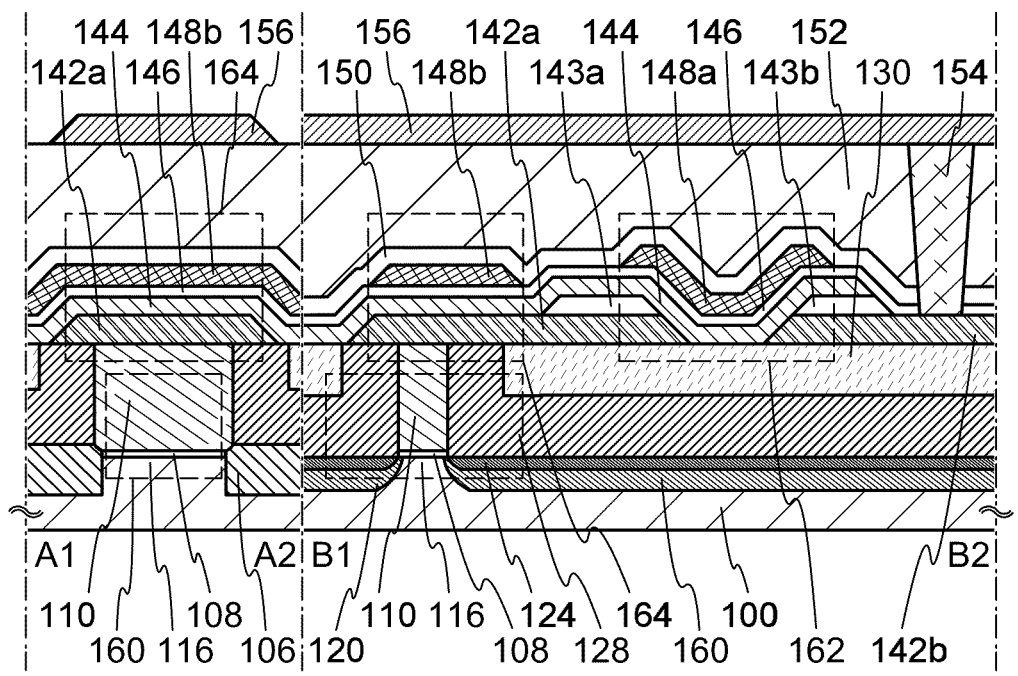
FIGS. 10A and 10B are a cross-sectional view and a plan view of a semiconductor device.
Figure 10B:
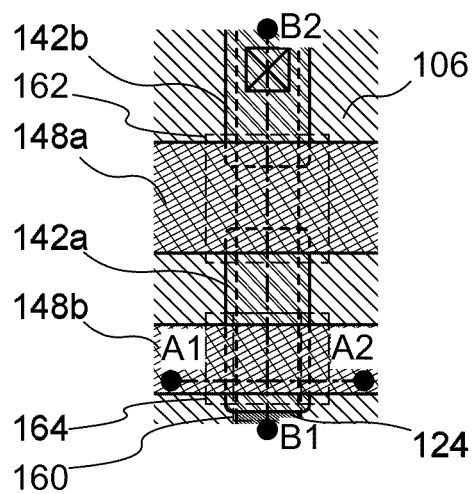

FIGS. 10A and 10B illustrate an example of a structure of a semiconductor device. FIG. 10A is a cross-sectional view of the semiconductor device, and FIG. 10B is a plan view of the semiconductor device. Here, FIG. 10A corresponds to a cross section along line A1-A2 and line B1-B2 in FIG. 10B. The semiconductor device illustrated in FIGS. 10A and 10B includes, in a lower portion, a transistor 160 including a first semiconductor material, and in an upper portion, a transistor 162 including a second semiconductor material. Here, the first semiconductor material and the second semiconductor material are preferably different materials. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor can hold charge for a long time owing to its characteristics.

Although both of the above transistors are n-channel transistors in the following description, it is needless to say that p-channel transistors can be used. Since the technical nature of the disclosed invention is to use a semiconductor material with which off-state current can be sufficiently decreased, such as an oxide semiconductor, in the transistor 162 so that data can be stored, it is not necessary to limit a specific structure of the semiconductor device, such as a material of the semiconductor device or a structure of the semiconductor device, to the structure described here.

The transistor 160 in FIGS. 10A and 10B includes a channel formation region 116 provided in a substrate 100 including a semiconductor material (such as silicon), impurity regions 120 provided such that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

Further, an element isolation insulating layer 106 is formed over the substrate 100 so as to surround the transistor 160, and an insulating layer 128 and an insulating layer 130 are formed to cover the transistor 160. Note that in order to realize higher integration, the transistor 160 preferably has a structure without a sidewall insulating layer as illustrated in FIGS. 10A and 10B. On the other hand, in the case where characteristics of the transistor 160 have priority, a sidewall insulating layer may be provided on a side surface of the gate electrode 110, and the impurity regions 120 may include a region having a different impurity concentration.

The transistor 162 in FIGS. 10A and 10B includes a source or drain electrode 142a and a source or drain electrode 142b provided over the insulating layer 130, an oxide semiconductor layer 144 electrically connected to the source or drain electrode 142a and the source or drain electrode 142b, a gate insulating layer 146 covering the source or drain electrode 142a, the source or drain electrode 142b, and the oxide semiconductor layer 144, a gate electrode 148a provided over the gate insulating layer 146 so as to overlap with the oxide semiconductor layer 144, an insulating layer 143a between the source or drain electrode 142a and the oxide semiconductor layer 144 in a region overlapping with the gate electrode 148a, and an insulating layer 143b between the source or drain electrode 142b and the oxide semiconductor layer 144 in a region overlapping with the gate electrode 148a. Although the insulating layer 143a and the insulating layer 143b are preferably provided in order to reduce the capacitance between the source or drain electrodes and the gate electrode, a structure in which the insulating layer 143a and the insulating layer 143b are not provided is also possible.

Here, the oxide semiconductor layer 144 is preferably an oxide semiconductor layer which is purified by sufficiently removing an impurity such as hydrogen therefrom or by sufficiently supplying oxygen thereto. Specifically, the hydrogen concentration of the oxide semiconductor layer 144 is $5 \times 10^{19}$ atoms/cm$^3$ or less, preferably $5 \times 10^{18}$ atoms/cm$^3$ or less, more preferably $5 \times 10^{17}$ atoms/cm$^3$ or less, for example. Note that the above hydrogen concentration of the oxide semiconductor layer 144 is measured by secondary ion mass spectrometry (SIMS). The carrier concentration of the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is less than $1 \times 10^{12}$/cm$^3$, preferably less than $1 \times 10^{11}$/cm$^3$, more preferably less than $1.45 \times 10^{10}$/cm$^3$. For example, the off-state current (per unit channel width (1 μm), here) at room temperature (25° C.) is 100 zA (1 zA (zeptoampere) is $1 \times 10^{-21}$ A) or less, preferably 10 zA or less. In this manner, by using an i-type (intrinsic) or substantially i-type oxide semiconductor, the transistor 162 which has extremely favorable off-state current characteristics can be obtained.

Although the oxide semiconductor layer 144 processed in an island shape is used in the transistor 162 of FIGS. 10A and 10B in order to suppress leakage caused among elements due to miniaturization, an oxide semiconductor layer not processed in an island shape may be used. When an oxide semiconductor layer is not processed in an island shape, the oxide semiconductor layer 144 can be prevented from being contaminated by etching during processing.

A capacitor 164 in FIGS. 10A and 10B includes the source or drain electrode 142a, the oxide semiconductor layer 144, the gate insulating layer 146, and an electrode 148b. In other words, the source or drain electrode 142a functions as one electrode of the capacitor 164, and the electrode 148b functions as the other electrode of the capacitor 164.

Note that in the capacitor 164 of FIGS. 10A and 10B, the oxide semiconductor layer 144 and the gate insulating layer 146 are stacked, whereby insulation between the source or drain electrode 142a and the electrode 148b can be sufficiently secured. It is needless to say that the capacitor 164 without including the oxide semiconductor layer 144 may be employed in order to secure sufficient capacitance. Alternatively, the capacitor 164 including an insulating layer that is formed in a manner similar to that of the insulating layer 143a may be employed. Furthermore, in the case where no capacitor is needed, a structure in which the capacitor 164 is not provided is also possible.

Note that in the transistor 162 and the capacitor 164, the source or drain electrode 142a and the source or drain electrode 142b preferably have tapered end portion. The source or drain electrode 142a and the source or drain electrode 142b preferably have tapered end portions because the coverage thereof with the oxide semiconductor layer 144 can be improved and disconnection thereof can be prevented. Here, the taper angle is 30° to 60°, for example. Note that the "taper angle" means an angle formed by the side surface and the bottom surface of a layer having a tapered shape (for example, the source or drain electrode 142a) when observed from a direction perpendicular to a cross section thereof (a plane perpendicular to the substrate surface).

In this embodiment, the transistor 162 and the capacitor 164 are provided so as to overlap with the transistor 160. By employing such a planar layout, higher integration can be realized. For example, given that the minimum feature size is F, the area occupied by a memory cell can be 15 $F^2$ to 25 $F^2$.

An insulating layer 150 is provided over the transistor 162 and the capacitor 164, and an insulating layer 152 is provided over the insulating layer 150. Then, an electrode 154 is provided in an opening formed in the gate insulating layer 146, the insulating layer 150, the insulating layer 152, and the like, and a wiring 156 is formed over the insulating layer 152 so as to be connected to the electrode 154. Although the source or drain electrode 142b and the wiring 156 are connected by the electrode 154 in FIGS. 10A and 10B, the disclosed invention is not limited to this structure. For example, the source or drain electrode 142b may be in direct contact with the metal compound region 124. Alternatively, the wiring 156 may be in direct contact with the source or drain electrode 142b.

<Method for Manufacturing Semiconductor Device>

Next, an example of a method for manufacturing the semiconductor device will be described. First, a method for manufacturing the transistor 160 in the lower portion will be described below with reference to FIGS. 11A to 11D and FIGS. 12A to 12C; then, a method for manufacturing the transistor 162 in the upper portion and the capacitor 164 will be described with reference to FIGS. 13A to 13D and FIGS. 14A to 14C.

<Method for Manufacturing Transistor in Lower Portion>

Figure 11A:
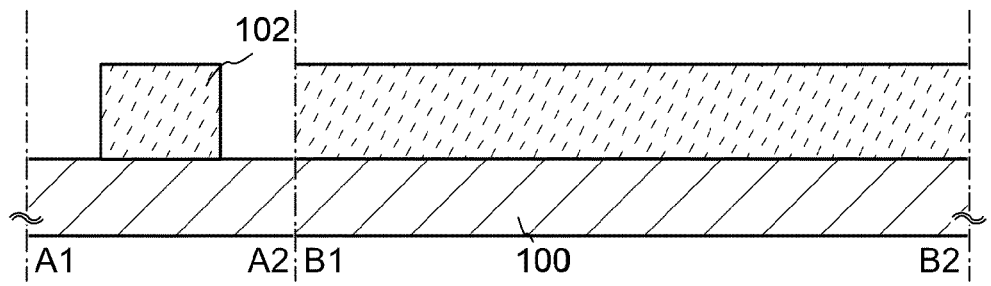
FIGS. 11A to 11D are cross-sectional views illustrating a manufacturing process of a semiconductor device.
Figure 11B:
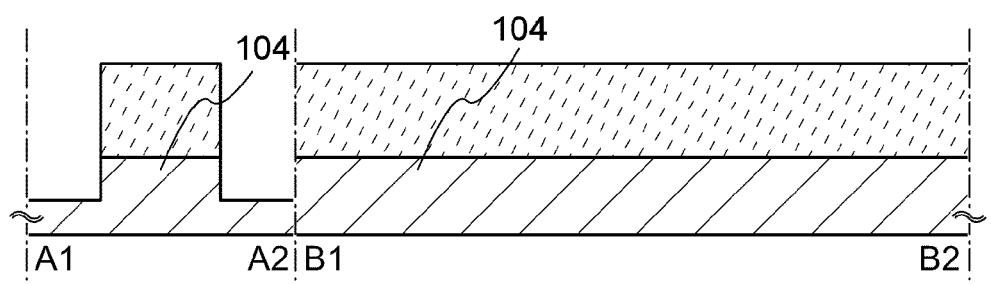

First, the substrate 100 including a semiconductor material is prepared (see FIG. 11A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the SOI substrate can be a substrate having a structure where a semiconductor layer is provided over an insulating substrate such as a glass substrate with an insulating layer interposed therebetween.

It is preferable that a single crystal semiconductor substrate of silicon or the like be particularly used as the substrate 100 including a semiconductor material because the speed of reading operation of the semiconductor device can be increased.

A protective layer 102 serving as a mask for forming an element isolation insulating layer is formed over the substrate 100 (see FIG. 11A). As the protective layer 102, an insulating layer formed using a material such as silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region not covered with the protective layer 102 (i.e., in an exposed region) is removed by etching using the protective layer 102 as a mask. Thus, a semiconductor region 104 isolated from other semiconductor regions is formed (see FIG. 11B). As the etching, dry etching is preferably performed, but wet etching may be performed. An etching gas or an etchant can be selected as appropriate depending on a material to be etched.

Figure 11C:
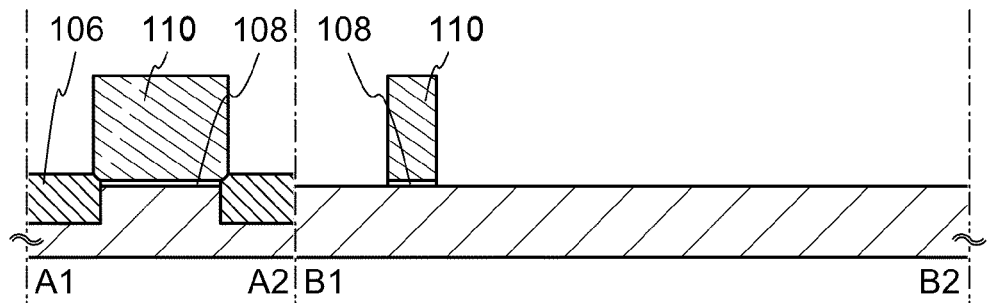

Then, an insulating layer is formed so as to cover the semiconductor region 104, and the insulating layer in a region overlapping with the semiconductor region 104 is selectively removed; thus, the element isolation insulating layer 106 is formed (see FIG. 11C). The insulating layer is formed using silicon oxide, silicon nitride, silicon oxynitride, or the like. As a method for removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is processed into a gate insulating layer later and can be formed by heat treatment (thermal oxidation treatment, thermal nitridation treatment, or the like) of the surface of the semiconductor region 104, for example. Instead of heat treatment, high-density plasma treatment may be employed. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. It is needless to say that the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The insulating layer can have a thickness of 1 nm to 100 nm, preferably, 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched; thus, the gate insulating layer 108 and the gate electrode 110 are formed (see FIG. 11C).

Figure 11D:
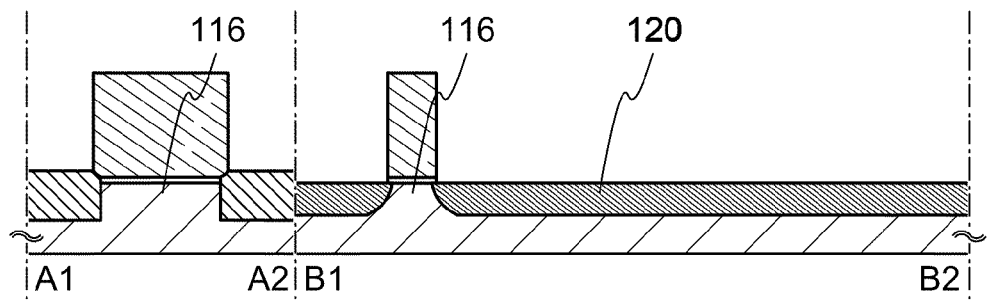

Next, phosphorus (P), arsenic (As), or the like is added to the semiconductor region 104, whereby the channel formation region 116 and the impurity regions 120 are formed (see FIG. 11D). Note that phosphorus or arsenic is added here in order to form an n-type transistor; an impurity element such as boron (B) or aluminum (Al) may be added in the case of forming a p-type transistor. Here, the concentration of the impurity added can be set as appropriate; the concentration is preferably set high when a semiconductor element is highly miniaturized.

Note that a sidewall insulating layer may be formed around the gate electrode 110, and impurity regions to which the impurity element is added at a different concentration may be formed.

Figure 12A:
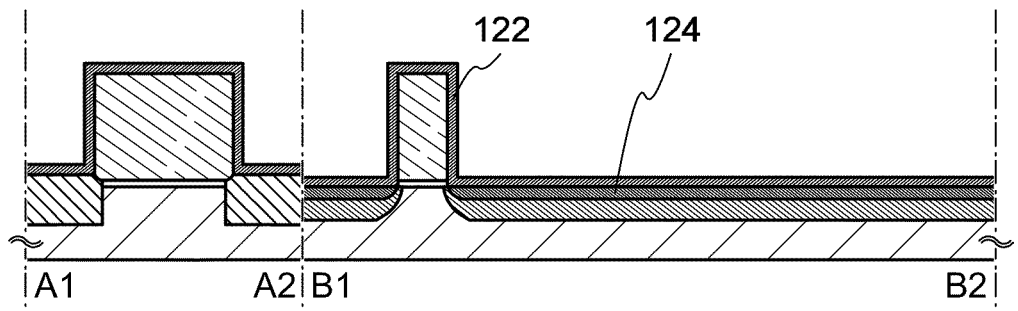
FIGS. 12A to 12C are cross-sectional views illustrating a manufacturing process of a semiconductor device.

Next, a metal layer 122 is formed so as to cover the gate electrode 110, the impurity regions 120, and the like (see FIG. 12A). The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material included in the semiconductor region 104. Examples of such metal materials are titanium, tantalum, tungsten, nickel, cobalt, platinum, and the like.

Next, heat treatment is performed so that the metal layer 122 reacts with the semiconductor material. Thus, the metal compound regions 124 that are in contact with the impurity regions 120 are formed (see FIG. 12A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 12B:
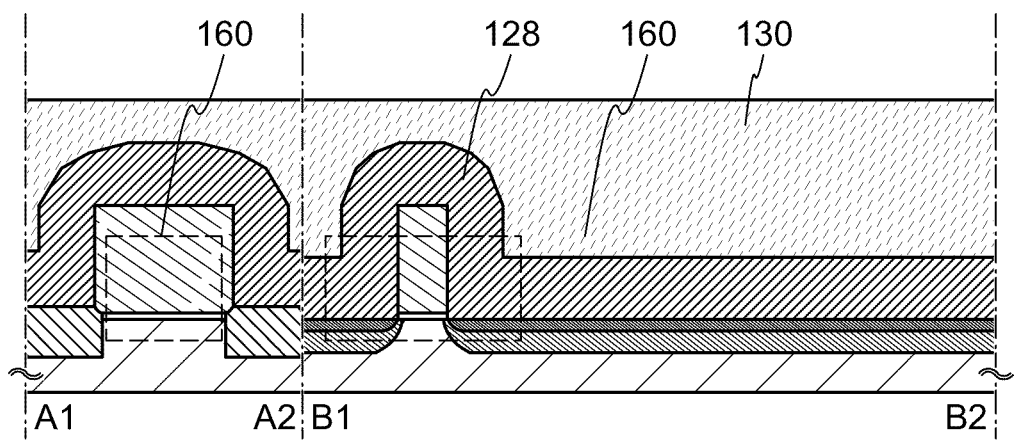

Next, the insulating layer 128 and the insulating layer 130 are formed so as to cover the components formed in the above steps (see FIG. 12B). The insulating layer 128 and the insulating layer 130 can be formed using an inorganic insulating material such as silicon oxide, silicon oxynitride, silicon nitride, or aluminum oxide. It is particularly preferable to use a low dielectric constant (low-k) material for the insulating layer 128 and the insulating layer 130 because capacitance due to overlap of electrodes or wirings can be sufficiently reduced. Note that a porous insulating layer with such a material may be employed as the insulating layer 128 and the insulating layer 130. The porous insulating layer has a lower dielectric constant than an insulating layer with high density and thus makes it possible to further reduce capacitance due to electrodes or wirings. Alternatively, the insulating layer 128 and the insulating layer 130 can be formed using an organic insulating material such as polyimide or acrylic. Note that although a stacked structure of the insulating layer 128 and the insulating layer 130 is used in this embodiment, an embodiment of the disclosed invention is not limited to this example. A single-layer structure or a stacked-layer structure including three or more layers can also be used.

Through the above steps, the transistor 160 is formed with the use of the substrate 100 including a semiconductor material (see FIG. 12B). A feature of the transistor 160 is that it can operate at high speed. With the use of that transistor as a transistor for reading, data can be read at high speed.

Figure 12C:
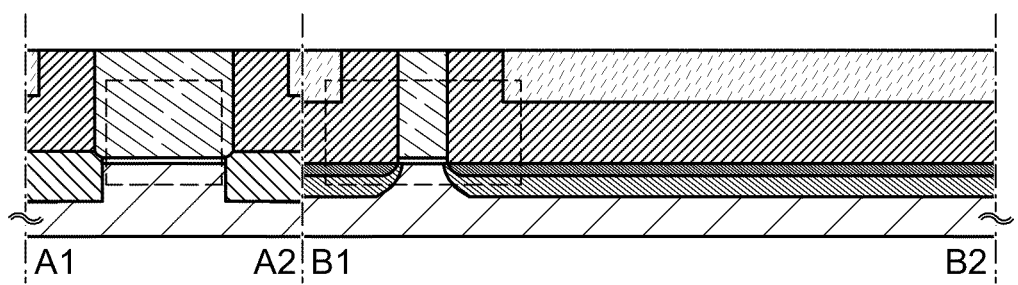

After that, as treatment performed before the transistor 162 and the capacitor 164 are formed, CMP treatment of the insulating layer 128 and the insulating layer 130 is performed so that an upper surface of the gate electrode 110 is exposed (see FIG. 12C). As treatment for exposing the upper surface of the gate electrode 110, etching treatment, or the like can also be employed instead of CMP treatment; in order to improve characteristics of the transistor 162, surfaces of the insulating layer 128 and the insulating layer 130 are preferably made as flat as possible.

Note that before or after each of the above steps, a step of forming an electrode, a wiring, a semiconductor layer, an insulating layer, or the like may be further performed. For example, when the wiring has a multi-layer structure of a stacked-layer structure including insulating layers and conductive layers, a highly integrated semiconductor device can be realized.

<Method for Manufacturing Transistor in Upper Portion>

Figure 13A:
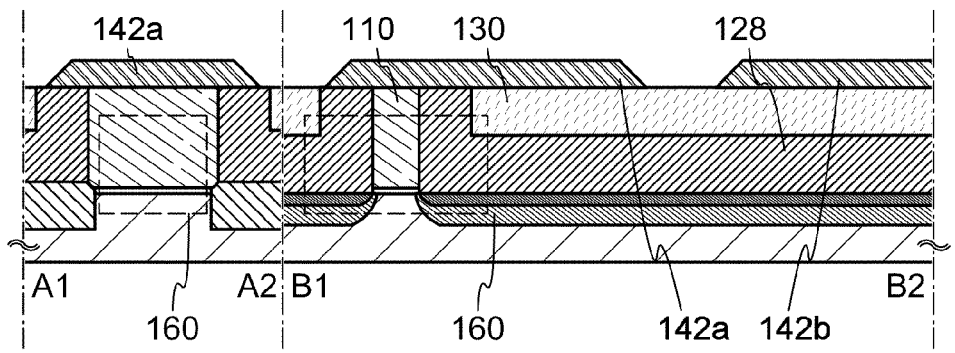
FIGS. 13A to 13D are cross-sectional views illustrating a manufacturing process of a semiconductor device.

Next, a conductive layer is formed over the gate electrode 110, the insulating layer 128, the insulating layer 130, and the like, and the source or drain electrode 142a and the source or drain electrode 142b are formed by selectively etching the conductive layer (see FIG. 13A).

The conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, or scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into the source or drain electrode 142a and the source or drain electrode 142b having a tapered shape.

The conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

The conductive layer is preferably etched such that the source or drain electrode 142a and the source or drain electrode 142b are formed to have tapered end portions. Here, the taper angle is preferably 30° to 60°, for example. When the source or drain electrode 142a and the source or drain electrode 142b are formed by etching so as to have tapered end portions, coverage of the source or drain electrode 142a and the source or drain electrode 142b with the gate insulating layer 146 which is formed later can be improved and disconnection of the gate insulating layer 146 can be prevented.

The channel length (L) of the transistor in the upper portion is determined by a distance between lower edge portions of the source or drain electrode 142a and the source or drain electrode 142b. Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. The resolution of light exposure with extreme ultraviolet rays is high and the depth of focus is large. For these reasons, the channel length (L) of the transistor to be formed later can be set in the range of 10 nm to 1000 nm (1 μm), and the circuit can operate at higher speed. In addition, power consumption of the semiconductor device can be reduced by miniaturization.

Note that an insulating layer functioning as a base may be provided over the insulating layer 128 and the insulating layer 130. The insulating layer can be formed by a PVD method, a CVD method, or the like.

Figure 13B:
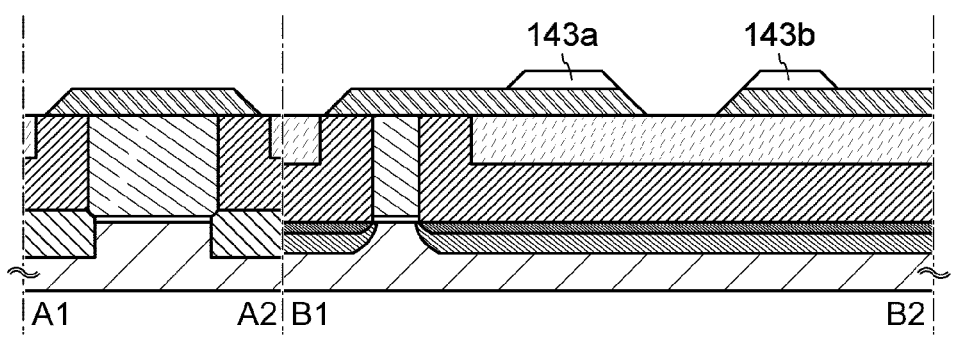

Next, the insulating layer 143a is formed over the source or drain electrode 142a, and the insulating layer 143b is formed over the source or drain electrode 142b (see FIG. 13B). The insulating layer 143a and the insulating layer 143b can be formed by forming an insulating layer so as to cover the source or drain electrode 142a and the source or drain electrode 142b and then by selectively etching the insulating layer. In addition, the insulating layer 143a and the insulating layer 143b are formed so as to overlap with part of a gate electrode which is formed later. With such insulating layers, capacitance between the gate electrode and the source or drain electrodes can be reduced.

The insulating layer 143a and the insulating layer 143b can be formed using an inorganic insulating material such as silicon oxide, silicon oxynitride, silicon nitride, or aluminum oxide. It is particularly preferable to use a low dielectric constant (low-k) material for the insulating layer 143a and the insulating layer 143b because capacitance between the gate electrode and the source or drain electrodes can be sufficiently reduced. Note that a porous insulating layer with such a material may be employed as the insulating layer 143a and the insulating layer 143b. The porous insulating layer has a lower dielectric constant than an insulating layer with high density and thus makes it possible to further reduce capacitance between the gate electrode and the source or drain electrodes.

Note that although the insulating layers 143a and 143b are preferably provided for reduction in capacitance between the gate electrode and the source or drain electrodes, a structure in which the insulating layers are not provided is also possible.

Figure 13C:
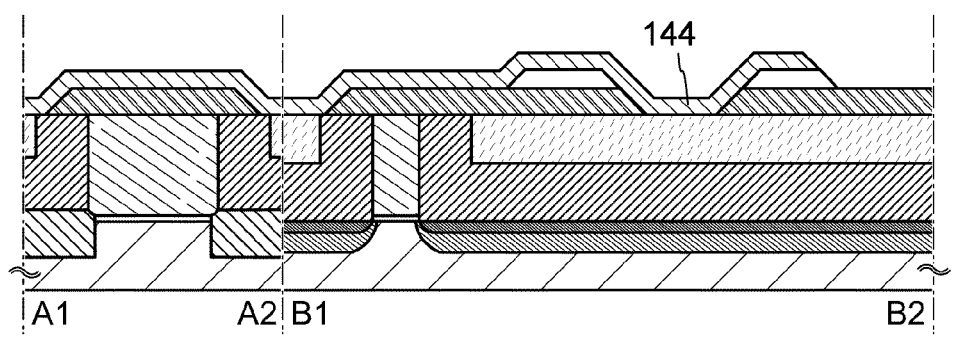
Figure 13D:
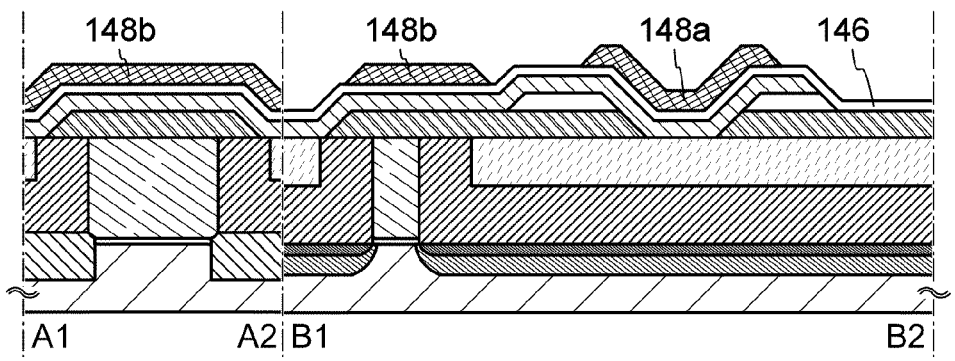

Next, the oxide semiconductor layer 144 is formed by forming an oxide semiconductor layer so as to cover the source or drain electrode 142a and the source or drain electrode 142b and then by selectively etching the oxide semiconductor layer (see FIG. 13C).

The oxide semiconductor layer can be formed using a four-component metal oxide such as In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, a single-component metal oxide such as an In—O-based oxide semiconductor, a Sn—O-based oxide semiconductor, or a Zn—O-based oxide semiconductor, or the like.

In particular, an In—Ga—Zn—O-based oxide semiconductor material has sufficiently high resistance when there is no electric field and thus off-state current can be sufficiently reduced. In addition, also having high field-effect mobility, the In—Ga—Zn—O-based oxide semiconductor material is suitable for a semiconductor material used in a semiconductor device.

As a typical example of the In—Ga—Zn—O-based oxide semiconductor material, an oxide semiconductor material represented by $InGaO_3(ZnO)_m$ (m>0 and m is not a natural number) is given. Using M instead of Ga, there is an oxide semiconductor material represented by $InMO_3(ZnO)_m$ (m>0 and m is not a natural number). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

As a target used for forming the oxide semiconductor layer by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of $In_2O_3:Ga_2O_3:ZnO=1:1:2$ [molar ratio] or the like can be used. Furthermore, a target having a composition ratio of $In_2O_3:Ga_2O_3:ZnO=1:1:1$ [molar ratio], a target having a composition ratio of $In_2O_3:Ga_2O_3:ZnO=1:1:4$ [molar ratio], or a target having a composition ratio of $In_2O_3:Ga_2O_3:ZnO=1:0:2$ [molar ratio] can also be used.

In this embodiment, an oxide semiconductor layer having an amorphous structure is formed by a sputtering method with the use of an In—Ga—Zn—O-based metal oxide target.

The relative density of the metal oxide in the metal oxide target is 80% or more, preferably 95% or more, and more preferably 99.9% or more. The use of the metal oxide target with high relative density makes it possible to form an oxide semiconductor layer having a dense structure.

The atmosphere in which the oxide semiconductor layer is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer may be room temperature (25° C.±10° C.). Then, moisture in the treatment chamber is removed, a sputtering gas from which hydrogen, water, or the like is removed is introduced, and the above-described target is used; thus, the oxide semiconductor layer is formed. By forming the oxide semiconductor layer while heating the object to be processed, an impurity in the oxide semiconductor layer can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbo pump provided with a cold trap may be used. Since hydrogen, water, or the like can be removed from the treatment chamber evacuated with a cryopump or the like, the concentration of an impurity in the oxide semiconductor layer can be reduced.

For example, conditions for forming the oxide semiconductor layer can be set as follows: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because powder substances (also referred to as particles or dust) generated in film formation can be reduced and the film thickness can be uniform. The thickness of the oxide semiconductor layer is set in the range of 1 nm to 50 nm, preferably 1 nm to 30 nm, more preferably 1 nm to 10 nm. The use of the oxide semiconductor layer of such a thickness makes it possible to suppress a short channel effect which is caused by miniaturization. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like.

Note that before the oxide semiconductor layer is formed by a sputtering method, reverse sputtering in which plasma is generated with an argon gas introduced is preferably performed so that a material attached to a formation surface (e.g., a surface of the insulating layer 130) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After that, heat treatment (first heat treatment) is preferably performed on the oxide semiconductor layer. Through the first heat treatment, excess hydrogen (including water or a hydroxyl group) in the oxide semiconductor layer can be removed, the structure of the oxide semiconductor layer can be ordered, and defect states in an energy gap can be reduced. For example, the temperature of the first heat treatment can be set higher than or equal to 300° C. and lower than 550° C., or higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen vacancies can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, a transistor with extremely excellent characteristics can be obtained with the use of the oxide semiconductor layer which is an i-type (intrinsic) or substantially i-type oxide semiconductor layer obtained by reducing an impurity through the first heat treatment.

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after the oxide semiconductor layer is formed, after the gate insulating layer is formed, or after a gate electrode is formed. Such dehydration treatment or dehydrogenation treatment may be performed once or plural times.

The etching of the oxide semiconductor layer may be performed either before the heat treatment or after the heat treatment. Dry etching is preferably used in terms of element miniaturization, but wet etching may be used. An etching gas or an etchant can be selected as appropriate depending on a material to be etched. Note that in the case where leakage in an element or the like does not cause a problem, the oxide semiconductor layer does not necessarily need to be processed in an island shape.

Next, the gate insulating layer 146 is formed in contact with the oxide semiconductor layer 144. Then, over the gate insulating layer 146, the gate electrode 148a is formed in a region overlapping with the oxide semiconductor layer 144, and the electrode 148b is formed in a region overlapping with the source or drain electrode 142a (see FIG. 13D).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, gallium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The gate insulating layer 146 may have a single-layer structure or a stacked-layer structure. There is no particular limitation on the thickness of the gate insulating layer 146; the thickness is preferably small in order to ensure the operation of the transistor when the semiconductor device is miniaturized. For example, in the case of using silicon oxide, the thickness can be 1 nm to 100 nm, preferably 10 nm to 50 nm.

When the gate insulating layer is thin as described above, gate leakage due to a tunnel effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate ($HfSi_xO_y$, (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)) is added. The use of a high-k material for the gate insulating layer 146 makes it possible to increase the thickness in order to suppress gate leakage as well as ensuring electrical properties. Note that a stacked-layer structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. In the case where the gate insulating layer 146 contains oxygen, oxygen can be supplied to the oxide semiconductor layer 144 and oxygen vacancies in the oxide semiconductor layer 144 can be filled; thus, the oxide semiconductor layer 144 which is i-type (intrinsic) or substantially i-type can also be formed.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as not to contain impurities other than main components as little as possible.

The gate electrode 148a and the electrode 148b can be formed by forming a conductive layer over the gate insulating layer 146 and then by selectively etching the conductive layer. The conductive layer to be the gate electrode 148a and the electrode 148b can be formed by a PVD method such as a sputtering method, or a CVD method such as a plasma CVD method. The details are similar to those of the source or drain electrode 142a or the like; thus, the description thereof can be referred to.

Figure 14A:
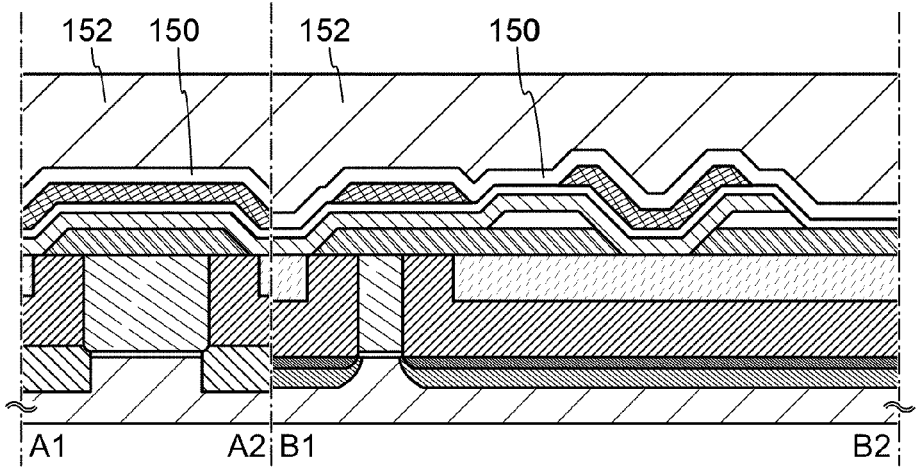
FIGS. 14A to 14C are cross-sectional views illustrating a manufacturing process of a semiconductor device.

Next, the insulating layer 150 and the insulating layer 152 are formed over the gate insulating layer 146, the gate electrode 148a, and the electrode 148b (see FIG. 14A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that the insulating layer 150 and the insulating layer 152 are preferably formed using a low dielectric constant material or a low dielectric constant structure (such as a porous structure). This is because when the insulating layer 150 and the insulating layer 152 have a low dielectric constant, capacitance generated between wirings, electrodes, or the like can be reduced and operation at higher speed can be achieved.

Note that although a stacked-layer structure of the insulating layer 150 and the insulating layer 152 is used in this embodiment, an embodiment of the disclosed invention is not limited to this example. A single-layer structure or a stacked-layer structure including three or more layers can also be used. Alternatively, a structure in which the insulating layers are not provided is also possible.

Note that the insulating layer 152 is desirably formed so as to have a flat surface. This is because when the insulating layer 152 has a flat surface, an electrode, a wiring, or the like can be favorably formed over the insulating layer 152 even in the case where the semiconductor device or the like is miniaturized. Note that the insulating layer 152 can be planarized using a method such as chemical mechanical polishing (CMP).

Figure 14B:
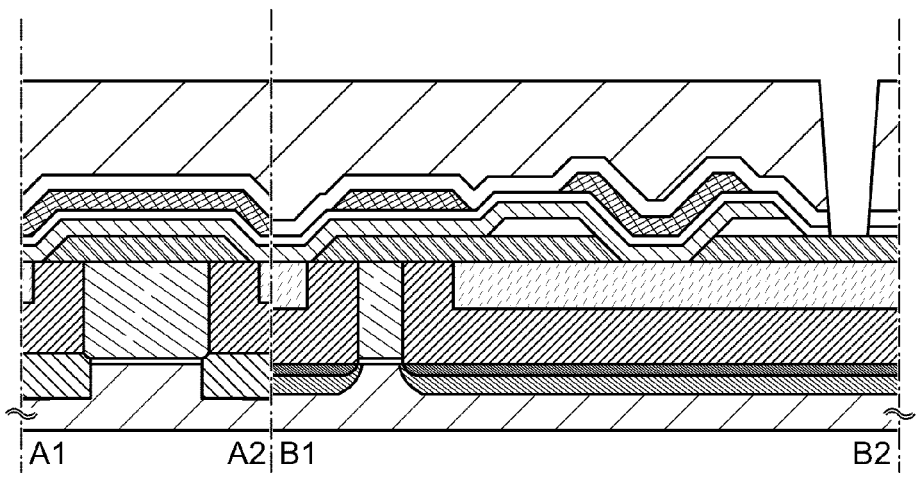

Next, an opening reaching the source or drain electrode 142b is formed in the gate insulating layer 146, the insulating layer 150, and the insulating layer 152 (see FIG. 14B). The opening is formed by selective etching with a mask or the like.

Figure 14C:
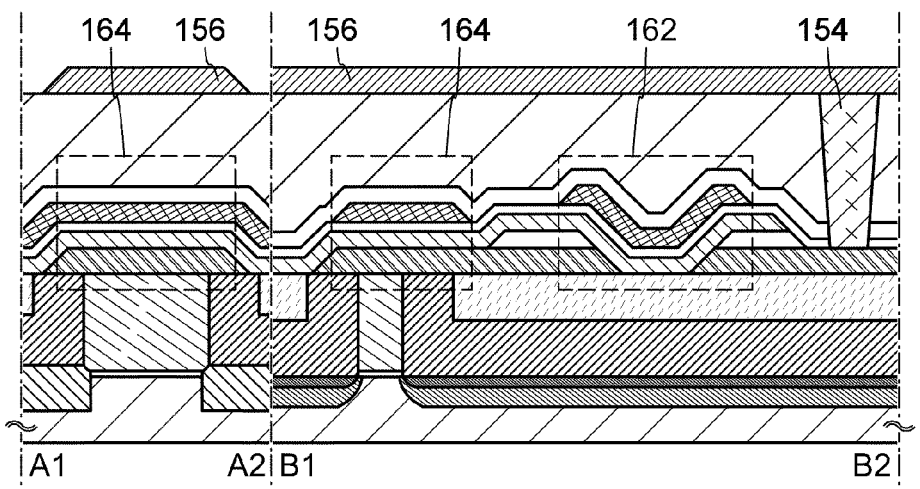

After that, the electrode 154 is formed in the opening, and the wiring 156 in contact with the electrode 154 is formed over the insulating layer 152 (see FIG. 14C).

The electrode 154 can be formed in such a manner, for example, that a conductive layer is formed in a region including the opening by a PVD method, a CVD method, or the like and then part of the conductive layer is removed by etching, CMP, or the like.

Specifically, it is possible to employ a method, for example, in which a thin titanium film is formed in a region including the opening by a PVD method and a thin titanium nitride film is formed by a CVD method, and then, a tungsten film is formed so as to be embedded in the opening. Here, the titanium film formed by a PVD method functions to reduce an oxide film (e.g., a natural oxide film) formed on a surface where the titanium film is formed, and to decrease the contact resistance with a lower electrode or the like (here, the source or drain electrode 142b). The titanium nitride film formed after the formation of the titanium film has a barrier function for suppressing diffusion of the conductive material. A copper film may be formed by a plating method after the formation of a barrier film of titanium, titanium nitride, or the like.

Note that in the case where the electrode is formed by removing part of the conductive layer, the process is preferably performed so that the surface is planarized. For example, when a thin titanium film or a thin titanium nitride film is formed in a region including the opening and then a tungsten film is formed so as to be embedded in the opening, excess tungsten, titanium, titanium nitride, or the like is removed and the planarity of the surface can be improved by subsequent CMP treatment. The surface including the electrode 154 is planarized in this manner, so that an electrode, a wiring, an insulating layer, a semiconductor layer, or the like can be favorably formed in a later step.

The wiring 156 is formed by forming a conductive layer by a PVD method such as a sputtering method, or a CVD method such as a plasma CVD method, and then by patterning the conductive layer. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used. The details are similar to those of the source or drain electrode 142a and the like.

Through the above steps, the transistor 162 including the oxide semiconductor layer 144, which is purified, and the capacitor 164 are completed (see FIG. 14C).

In the transistor 162 described in this embodiment, the oxide semiconductor layer 144 is purified and thus contains hydrogen at a concentration of $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the carrier density of the oxide semiconductor layer 144 is, for example, less than $1 \times 10^{12}$/cm$^3$, preferably less than $1.45 \times 10^{10}$/cm$^3$, which is sufficiently lower than the carrier density of a general silicon wafer (approximately $1 \times 10^{14}$/cm$^3$). In addition, the off-state current of the transistor 162 is sufficiently small. For example, the off-state current (per unit channel width (1 μm), here) of the transistor 162 at room temperature (25° C.) is 100 zA (1 zA (zeptoampere) is $1 \times 10^{-21}$ A) or less, preferably 10 zA or less.

In this manner, by using the oxide semiconductor layer 144 which is purified and is intrinsic, it becomes easy to sufficiently reduce the off-state current of the transistor. With the use of such a transistor, a semiconductor device in which stored data can be held for an extremely long time can be provided.

The structures, methods, and the like described in this embodiment can be combined as appropriate with any of the structures, methods, and the like described in the other embodiments.

Embodiment 3

In this embodiment, the cases where the semiconductor device described in any of the above embodiments is applied to electronic devices will be described with reference to FIGS. 15A to 15F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 15A:
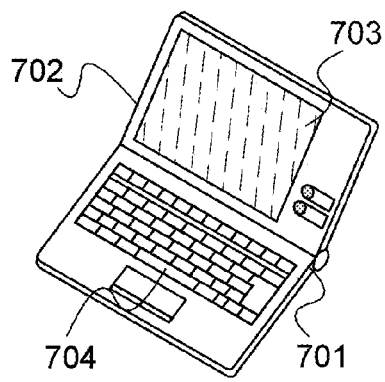
FIGS. 15A to 15F each illustrate an electronic device including a semiconductor device.

FIG. 15A illustrates a notebook personal computer, which includes a housing 701, a housing 702, a display portion 703, a keyboard 704, and the like. The semiconductor device described in any of the above embodiments is provided in at least one of the housings 701 and 702. Thus, a notebook personal computer with sufficiently low power consumption, in which writing and reading of data can be performed at high speed and data can be stored for a long time, can be realized.

Figure 15B:
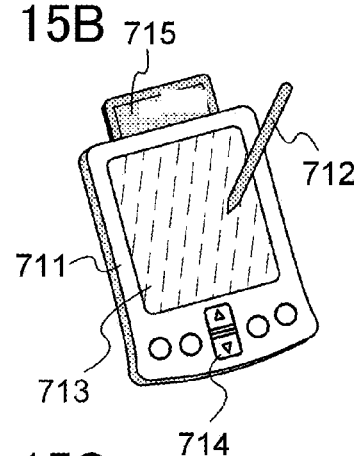

FIG. 15B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in any of the above embodiments is provided in the main body 711. Thus, a portable information terminal with sufficiently low power consumption, in which writing and reading of data can be performed at high speed and data can be stored for a long time, can be realized.

Figure 15C:
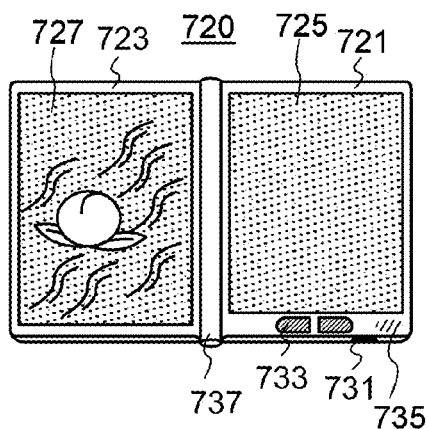

FIG. 15C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book 720 can be opened and closed using the hinge 737 as an axis. In addition, the housing 721 is provided with a power switch 731, operation keys 733, a speaker 735, and the like. At least one of the housings 721 and 723 is provided with the semiconductor device described in any of the above embodiments. Thus, an electronic book with sufficiently low power consumption, in which writing and reading of data can be performed at high speed and data can be stored for a long time, can be realized.

Figure 15D:
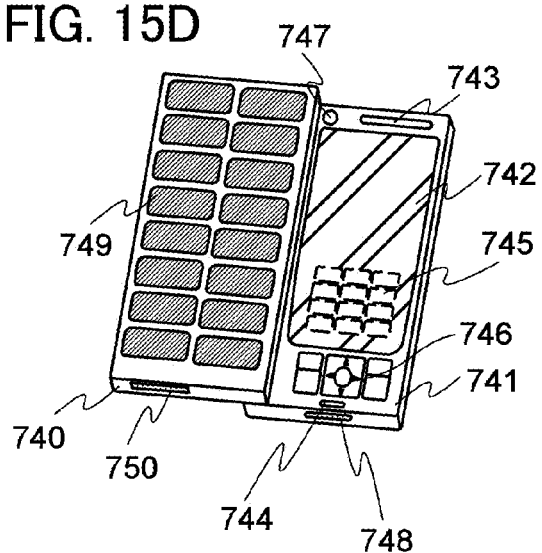

FIG. 15D illustrates a mobile phone set, which includes two housings, a housing 740 and a housing 741. Moreover, the housings 740 and 741 in a state where they are developed as illustrated in FIG. 15D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in any of the above embodiments is provided in at least one of the housings 740 and 741. Thus, a mobile phone set with sufficiently low power consumption, in which writing and reading of data can be performed at high speed and data can be stored for a long time, can be realized.

Figure 15E:
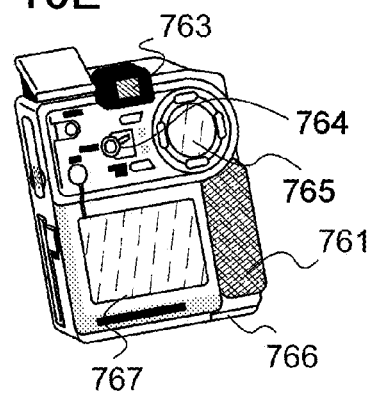

FIG. 15E illustrates a digital camera, which includes a main body 761, a display portion 767, an eyepiece 763, an operation switch 764, a display portion 765, a battery 766, and the like. The semiconductor device described in any of the above embodiments is provided in the main body 761. Thus, a digital camera with sufficiently low power consumption, in which writing and reading of data can be performed at high speed and data can be stored for a long time, can be realized.

Figure 15F:
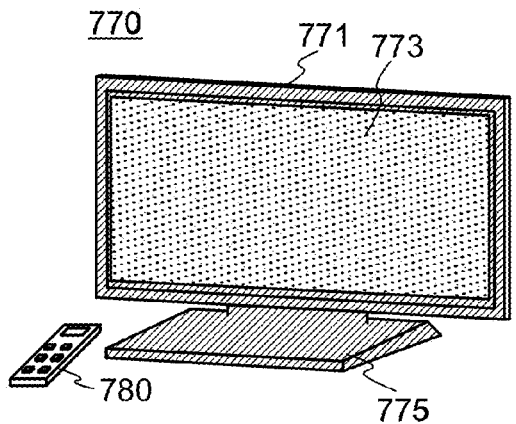

FIG. 15F is a television set 770, which includes a housing 771, a display portion 773, a stand 775, and the like. The television set 770 can be operated with a switch included in the housing 771 or with a remote controller 780. The semiconductor device described in any of the above embodiments is mounted in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

Example 1

In this example, results of measuring the off-state current of a transistor including a purified oxide semiconductor will be described.

Figure 16:
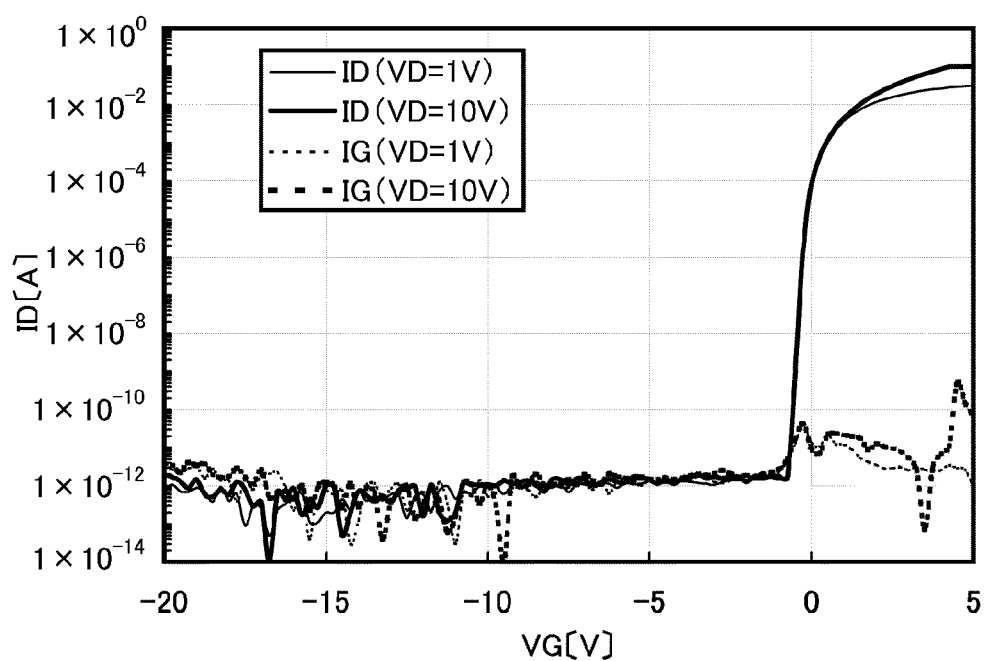
FIG. 16 is a graph showing characteristics of a transistor including an oxide semiconductor.

First, a transistor with a channel width W of 1 m, which is sufficiently wide, was prepared in consideration of a very small off-state current of a transistor including a purified oxide semiconductor, and the off-state current was measured. FIG. 16 shows the results of measuring the off-state current of the transistor with a channel width W of 1 m. In FIG. 16, the horizontal axis shows a gate voltage VG and the vertical axis shows a drain current ID. In the case where the drain voltage VD is +1 V or +10 V and the gate voltage VG is within the range of −5 V to −20 V, the off-state current of the transistor is found to be smaller than or equal to $1 \times 10^{-12}$ A which is the detection limit. In addition, the off-state current (per unit channel width (1 μm), here) of the transistor is found to be smaller than or equal to 1 aA/μm ($1 \times 10^{-18}$ A/μm).

Next, the results of more accurately measuring the off-state current of the transistor including a purified oxide semiconductor will be described. As described above, the off-state current of the transistor including a purified oxide semiconductor is found to be smaller than or equal to $1 \times 10^{-12}$ A which is the detection limit of measurement equipment. Here, the results of measuring more accurate off-state current (a value smaller than or equal to the detection limit of measurement equipment in the above measurement), with the use of an element for characteristic evaluation, will be described.

First, the element for characteristic evaluation which is used in a method for measuring current will be described with reference to FIG. 17.

Figure 17:
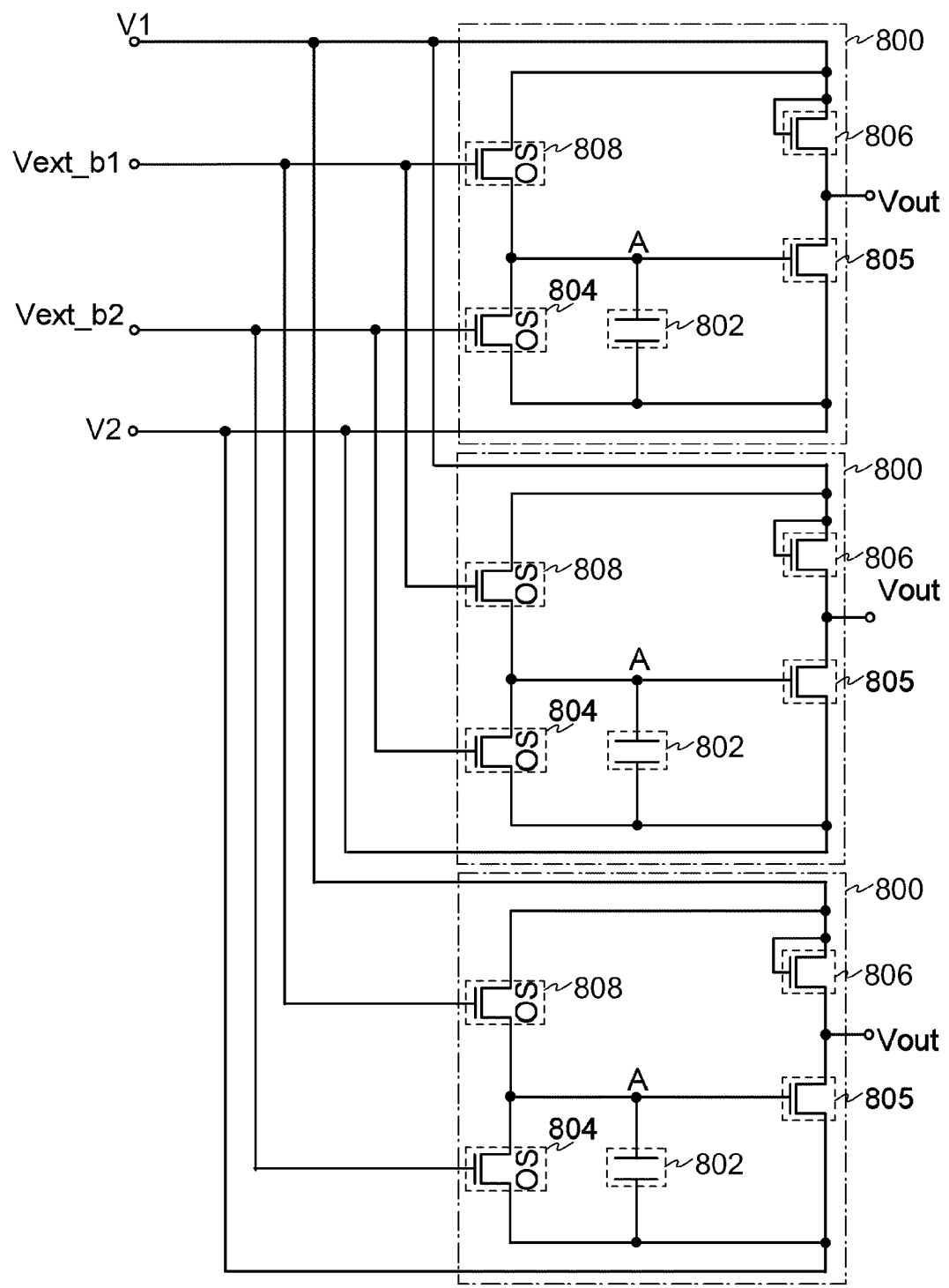
FIG. 17 is a circuit diagram of an element for evaluating characteristics of a transistor including an oxide semiconductor.

In the element for characteristic evaluation in FIG. 17, three measurement systems 800 are connected in parallel. The measurement systems 800 each include a capacitor 802, a transistor 804, a transistor 805, a transistor 806, and a transistor 808. As the transistor 804, the transistor 805, the transistor 806, and the transistor 808, transistors including a purified oxide semiconductor were employed.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other and connected to an output terminal.

Note that a potential Vext_b2 for controlling whether to turn on or off the transistor 804 is supplied to the gate terminal of the transistor 804, and a potential Vext_b1 for controlling whether to turn on or off the transistor 808 is supplied to the gate terminal of the transistor 808. A potential Vout is output from the output terminal.

Next, a method for measuring current with the use of the element for characteristic evaluation will be described.

First, an initialization period in which a potential difference is generated to measure the off-state current will be briefly described. In the initialization period, the potential Vext_b1 for turning on the transistor 808 is input to the gate terminal of the transistor 808. Accordingly, a potential V1 is supplied to a node A that is connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is, for example, a high potential. In addition, a potential at which the transistor 804 is turned off is supplied as Vext_b2, so that the transistor 804 is turned off.

After that, the potential Vext_b1 for turning off the transistor 808 is input to the gate terminal of the transistor 808, so that the transistor 808 is turned off. After the transistor 808 is turned off, the potential V1 is set to a low potential. Still, the transistor 804 is turned off. The potential V2 is equal to the potential V1. Thus, the initialization period is completed. When the initialization period is completed, a potential difference is generated between the node A and one of the source terminal and the drain terminal of the transistor 804. In addition, a potential difference is generated between the node A and the other of the source terminal and the drain terminal of the transistor 808. Accordingly, a small amount of electric charge flows through the transistor 804 and the transistor 808. That is, the off-state current is generated.

Next, a measurement period of the off-state current will be briefly described. In the measurement period, the potential (that is, V2) of one of the source terminal and the drain terminal of the transistor 804 and the potential (that is, V1) of the other of the source terminal and the drain terminal of the transistor 808 are fixed to a low potential. On the other hand, the potential of the node A is not fixed (the node A is in a floating state) in the measurement period. Accordingly, charge flows through the transistor 804, and the amount of charge held at the node A changes over time. The potential of the node A changes depending on the change in the amount of charge held at the node A. That is, the output potential Vout of the output terminal also changes.

Figure 18:
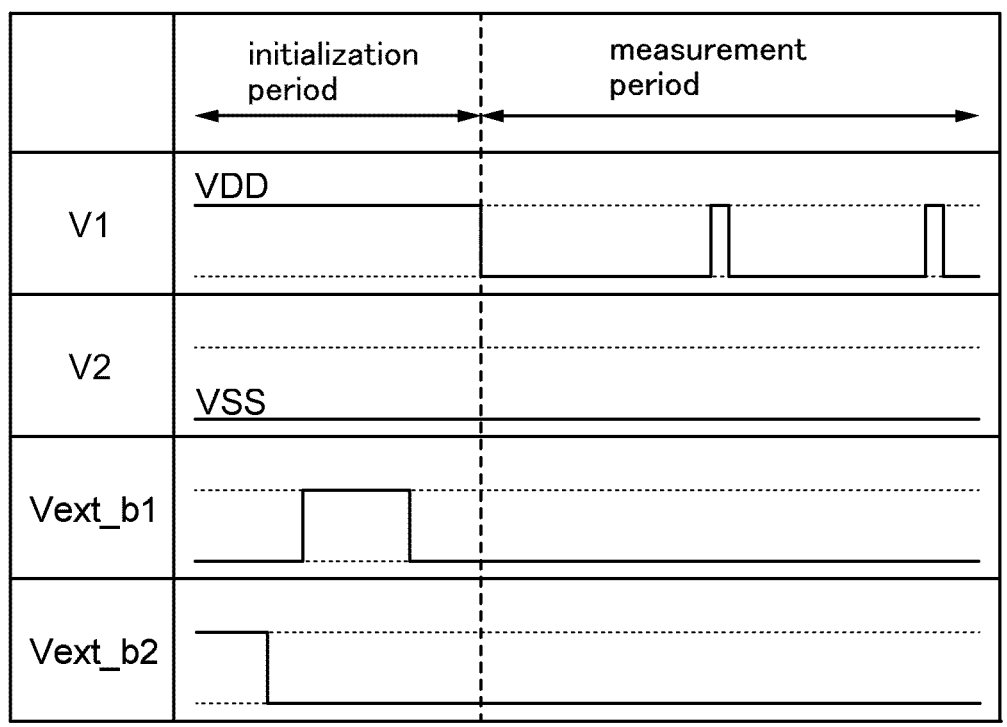
FIG. 18 is a timing chart of an element for evaluating characteristics of a transistor including an oxide semiconductor.

FIG. 18 shows details (a timing chart) of the relationship among potentials in the initialization period in which the potential difference is generated and those in the following measurement period.

In the initialization period, first, the potential Vext_b2 is set to a potential (a high potential) at which the transistor 804 is turned on. Thus, the potential of the node A becomes V2, that is, a low potential (VSS). Note that it is not essential to supply a low potential (VSS) to the node A. After that, the potential Vext_b2 is set to a potential (a low potential) at which the transistor 804 is turned off, so that the transistor 804 is turned off. Next, the potential Vext_b1 is set to a potential (a high potential) at which the transistor 808 is turned on. Accordingly, the potential of the node A becomes V1, that is, a high potential (VDD). Then, Vext_b1 is set to a potential at which the transistor 808 is turned off, which places the node A in a floating state and finishes the initialization period.

In the measurement period after the initialization period, the potential V1 and the potential V2 are set such that charge flows to the node A or charge flows out of the node A. Here, the potential V1 and the potential V2 are set to a low potential (VSS). Note that at the time when the output potential Vout is measured, it is necessary to operate an output circuit and thus temporarily set V1 to a high potential (VDD) in some cases. Note that the period in which V1 is set to a high potential (VDD) is made short to such a degree that the measurement is not influenced.

When the potential difference is generated and the measurement period is started as described above, the amount of charge held at the node A changes over time, which causes the potential of the node A to change. This means that the potential of the gate terminal of the transistor 805 changes; thus, the output potential Vout of the output terminal also changes over time.

A method for calculating the off-state current on the basis of the obtained output potential Vout is described below.

The relationship between a potential $V_A$ of the node A and the output potential Vout is obtained before calculation of the off-state current. With this relationship, the potential $V_A$ of the node A can be obtained using the output potential Vout. In accordance with the above relationship, the potential $V_A$ of the node A can be expressed as a function of the output potential Vout by the following equation.

$$V_A = F(Vout) \qquad \text{[Formula 1]}$$

Charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[Formula 2]}$$

Current $I_A$ of the node A is a time derivative of charge which flows to the node A (or charge which flows out of the node A), and is thus expressed by the following equation.

$$I_A = \frac{\Delta Q_A}{\Delta t} = \frac{C_A \cdot \Delta F(Vout)}{\Delta t} \quad \text{[Formula 3]}$$

In this manner, the current $I_A$ of the node A can be obtained from the capacitance $C_A$ connected to the node A and the output potential Vout of the output terminal.

In accordance with the above method, it is possible to measure leakage current (off-state current) which flows between a source and a drain of a transistor in an off state.

In this example, the transistor 804, the transistor 805, the transistor 806, and the transistor 808 were manufactured using a purified oxide semiconductor with a channel length L of 10 µm and a channel width W of 50 µm. In addition, in the measurement systems 800 which are arranged in parallel, the capacitances of the capacitors 802 were 100 fF, 1 pF, and 3 pF.

Note that VDD was 5 V and VSS was 0 V in the measurement of this example. In the measurement period, Vout was measured while the potential V1 was basically set to VSS and changed to VDD for 100 msec at intervals of 10 sec to 300 sec. In addition, Δt used in calculation of current I which flows through the element was approximately 30000 sec.

Figure 19:
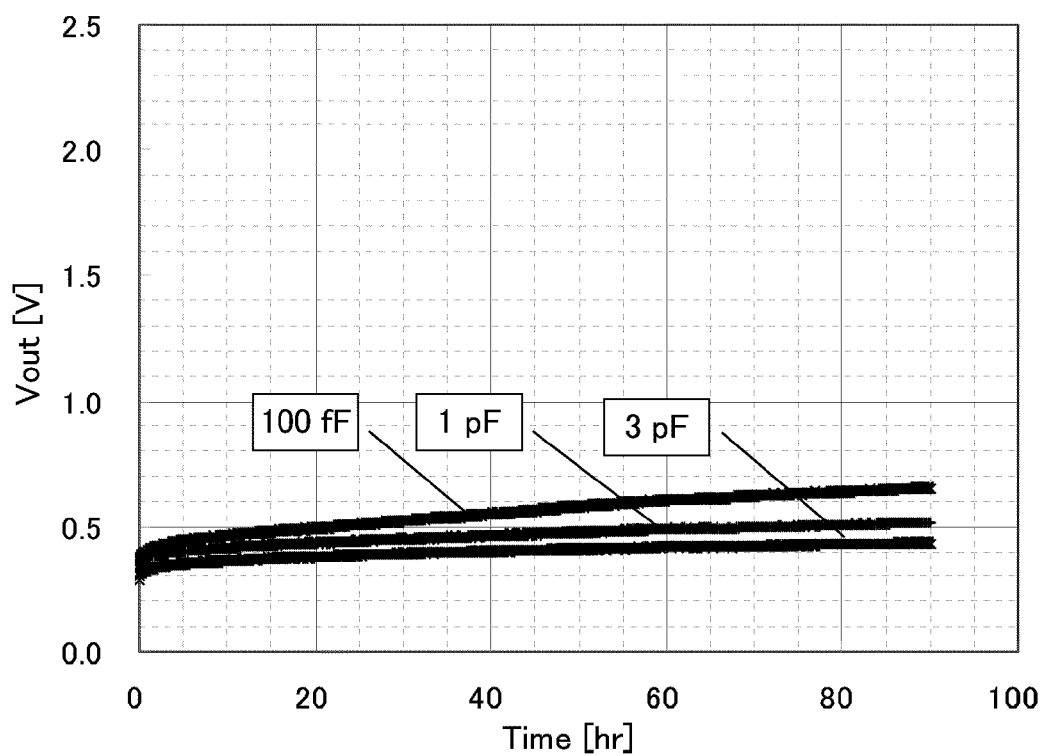
FIG. 19 is a graph showing characteristics of a transistor including an oxide semiconductor.

FIG. 19 shows the relationship between the elapsed time Time in the above current measurement and the output potential Vout. It can be confirmed from FIG. 19 that the potential changes as time elapses.

Figure 20:
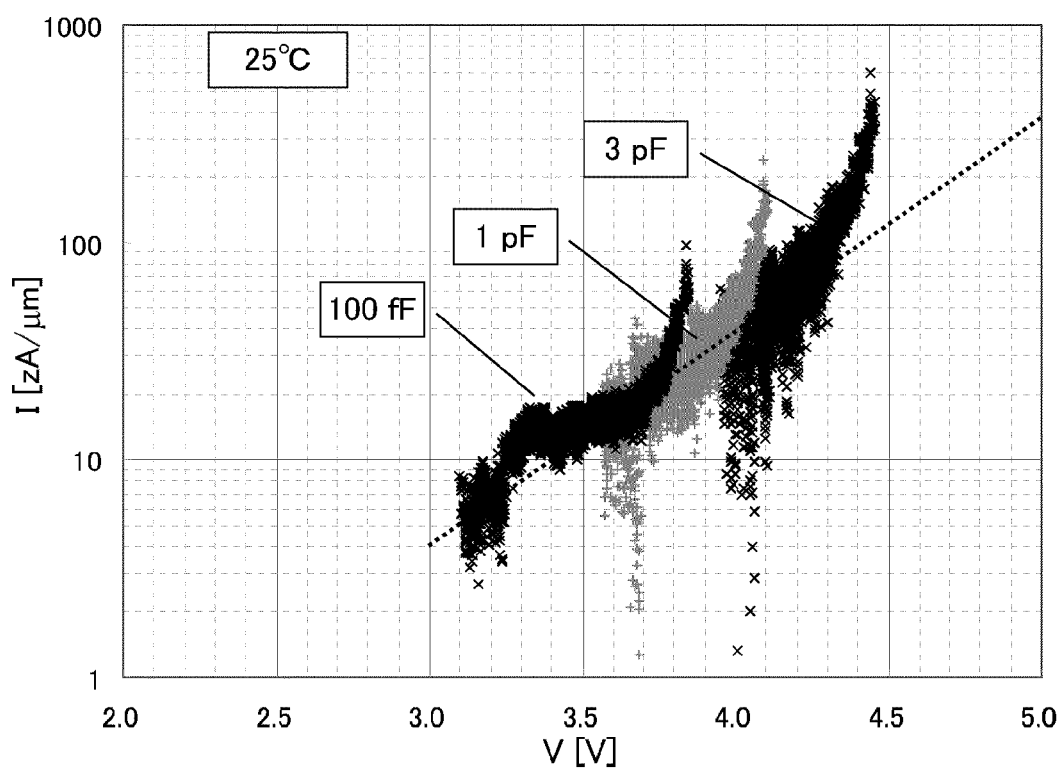
FIG. 20 is a graph showing characteristics of a transistor including an oxide semiconductor.

FIG. 20 shows the off-state current at room temperature (25° C.) which is calculated in the above current measurement. Note that FIG. 20 shows the relationship between the source-drain voltage V and the off-state current I. It is found from FIG. 20 that the off-state current is about 40 zA/µm under the condition where the source-drain voltage is 4 V. It is also found that the off-state current is smaller than or equal to 10 zA/µm under the condition where the source-drain voltage is 3.1 V. Note that 1 zA represents $10^{-21}$ A.

Figure 21:
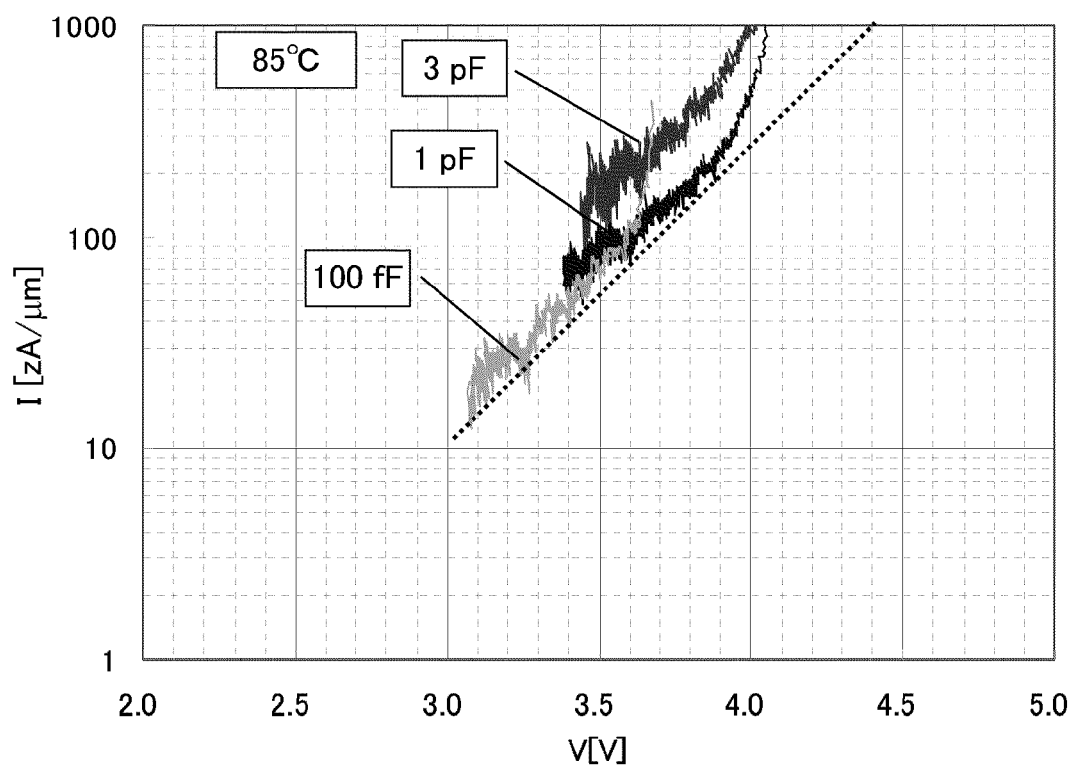
FIG. 21 is a graph showing characteristics of a transistor including an oxide semiconductor.

Furthermore, FIG. 21 shows the off-state current in an environment at a temperature of 85° C., which is calculated in the above current measurement. FIG. 21 shows the relationship between the source-drain voltage V and the off-state current I in an environment at a temperature of 85° C. It is found from FIG. 21 that the off-state current is smaller than or equal to 100 zA/µm under the condition where the source-drain voltage is 3.1 V.

As described above, it is confirmed from this example that the off-state current of a transistor including a purified oxide semiconductor is sufficiently small.

Example 2

The number of times the memory cell according to an embodiment of the disclosed invention can rewrite data was examined. In this example, the examination results will be described with reference to FIGS. 22A to 22C.

A semiconductor device used for the examination is the semiconductor device having the circuit configuration in FIG. 1A-1. Here, an oxide semiconductor was used for a transistor corresponding to the transistor 162. A capacitor with a capacitance of 0.33 pF was used as a capacitor corresponding to the capacitor 164.

The examination was performed by comparing the initial memory window width and the memory window width after holding and writing data were repeated a predetermined number of times. Data was held by and written to the memory cell by applying 0 V or 5 V to a wiring corresponding to the third wiring in FIG. 1A-1 and applying 0 V or 5 V to a wiring corresponding to the fourth wiring. When the potential of the wiring corresponding to the fourth wiring is 0 V, the transistor (a transistor for writing) corresponding to the transistor 162 is turned off; thus, a potential supplied to the node FG is held. When the potential of the wiring corresponding to the fourth wiring is V, the transistor corresponding to the transistor 162 is turned on; thus, a potential of the wiring corresponding to the third wiring is supplied to the node FG.

The memory window width is one of indicators of characteristics of a memory device. Here, the memory window width represents the shift amount ΔVcg between curves (Vcg–Id curves) in different memory states, which show the relationship between the potential Vcg of a wiring corresponding to the fifth wiring and the drain current Id of a transistor (transistor for reading) corresponding to the transistor 160. The different memory states mean a state where 0 V is applied to the node FG (hereinafter referred to as a low state) and a state where 5 V is applied to the node FG (hereinafter referred to as a high state). That is, the memory window width can be checked by sweeping the potential Vcg in the low state and in the high state.

Figure 22A:
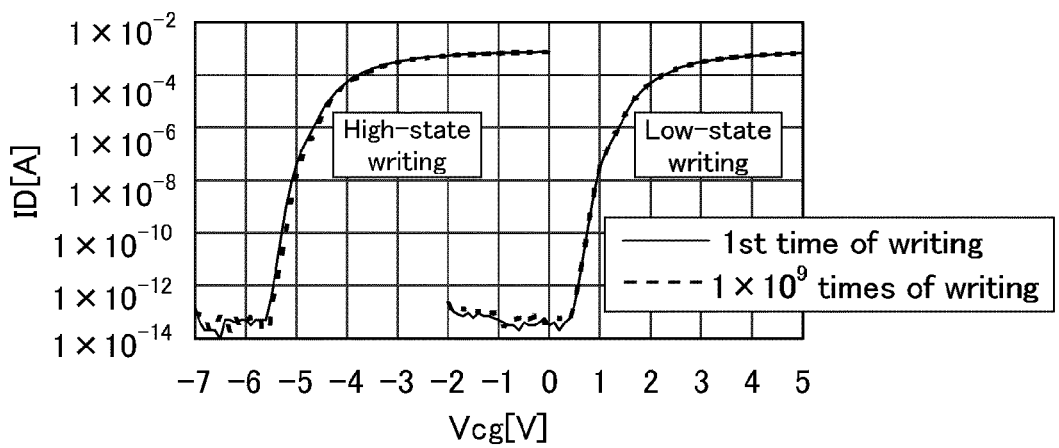
FIGS. 22A to 22C are graphs showing examination results of memory window widths.

FIG. 22A shows the examination results of the initial memory window width and the memory window width after writing was performed $1 \times 10^9$ times. Note that in FIG. 22A, the horizontal axis shows Vcg (V) and the vertical axis shows Id (A).

As shown in FIG. 22A, there is almost no difference between the Vcg–Id curves before and after $1 \times 10^9$ times of writing either in low-state writing or high-state writing. In addition, there is almost no difference between the shift amount (ΔVcg) between the Vcg–Id curves in low-state writing and in high-state writing before $1 \times 10^9$ times of writing and the shift amount after $1 \times 10^9$ times of writing.

Figure 22B:
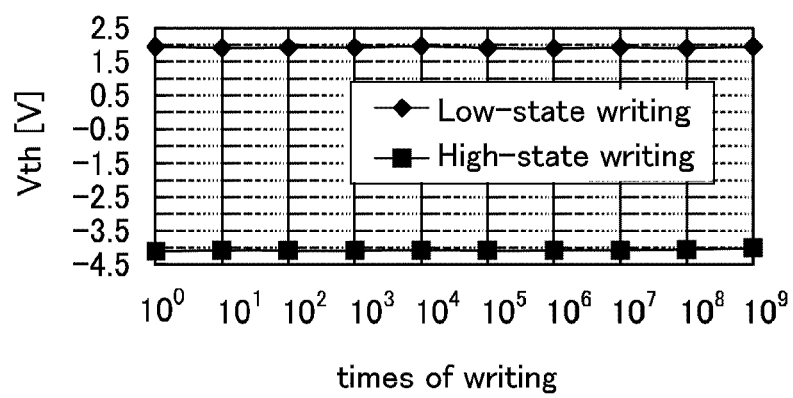

FIG. 22B illustrates the relationship between the potential of the wiring corresponding to the fifth wiring which is needed to turn on the transistor 160 in high-state wiring and low-state writing, and the number of times of rewriting. In FIG. 22B, the horizontal axis shows the number of times of rewriting and the vertical axis shows the potential of the wiring corresponding to the fifth wiring, that is, the apparent threshold voltage $V_{th}$ (V) of the transistor 160.

Note that a threshold voltage can be generally obtained by the tangent method. Specifically, in the graph where the horizontal axis shows the gate voltage Vg and the vertical axis shows the square root of the drain current Id, the tangent to the point of maximum slope of the curve is obtained. The horizontal axis (the value of the gate voltage Vg) intercept of the tangent is the threshold voltage $V_{th}$. Also in FIG. 22B, the apparent threshold voltage $V_{th}$ was obtained by the tangent method.

The memory window widths obtained from FIG. 22B are given in Table 1. Note that the memory window width, which was obtained by calculation, is the difference between the apparent threshold voltage $V_{th\_H}$ of the transistor 160 in high-state writing and the apparent threshold voltage $V_{th\_L}$ of the transistor 160 in low-state writing.

TABLE 1

| number of times of writing | $1 \times 10^0$ | $1 \times 10^1$ | $1 \times 10^2$ | $1 \times 10^3$ | $1 \times 10^4$ | $1 \times 10^5$ | $1 \times 10^6$ | $1 \times 10^7$ | $1 \times 10^8$ | $1 \times 10^9$ |
|---|---|---|---|---|---|---|---|---|---|---|
| memory window width | 6.06 | 6.00 | 6.01 | 6.01 | 6.04 | 6.00 | 5.98 | 6.01 | 5.96 | 5.96 |

As is seen in Table 1, in the memory cell of this example, the difference between the memory window widths before and after $1 \times 10^9$ times of writing is 2% or less, specifically 1.68%. Therefore, it is found that the semiconductor device is not deteriorated at least by $1 \times 10^9$ times of writing.

Figure 22C:
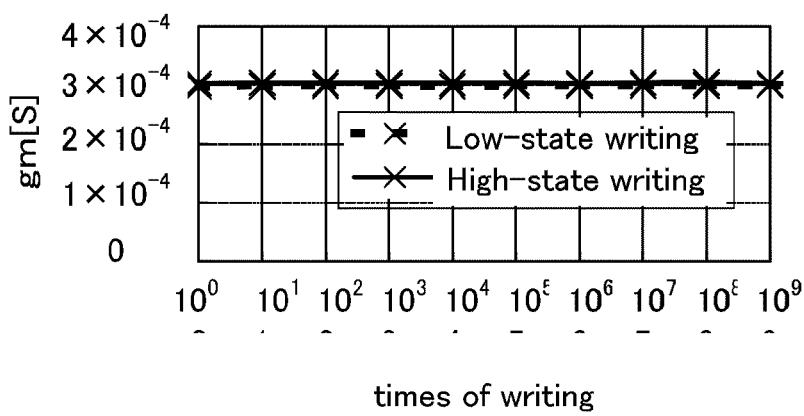

FIG. 22C shows the relationship between the number of times of rewriting and the mutual conductance (gm) of the memory cell. In FIG. 22C, the horizontal axis shows the number of times of rewriting, and the vertical axis shows the mutual conductance (gm).

A decrease in the mutual conductance (gm) of the memory cell has an influence such as difficulty in discrimination between a written state and an erased state. As shown in FIG. 22C, it is found that hardly any change in gm of the memory cell of this example can be observed even after $1 \times 10^9$ times of rewriting. Thus, it can be said that the semiconductor device according to this example is a highly reliable semiconductor device which is not deteriorated even by $1 \times 10^9$ times of rewriting.

As described above, characteristics of the memory cell according to one embodiment of the disclosed invention are not changed even when storing and writing of data are repeated as many as $1 \times 10^9$ times, and the memory cell has extremely high writing durability. That is, it can be said that a memory cell having excellent reliability and a semiconductor device which incorporates the memory cell and has excellent reliability are realized according to an embodiment of the disclosed invention.

This application is based on Japanese Patent Application serial no. 2010-035386 filed with Japan Patent Office on Feb. 19, 2010, the entire contents of which are hereby incorporated by reference.

The invention claimed is:

1. A semiconductor device comprising:
a write word line;
a read word line;
a bit line;
a source line;
a signal line;
a memory cell array including a plurality of memory cells;
a first driver circuit;
a second driver circuit; and
a potential conversion circuit,
wherein one of the plurality of memory cells comprises:
   a first transistor including a first gate, a first source, a first drain, and a first channel formation region;
   a second transistor including a second gate, a second source, a second drain, and a second channel formation region; and
   a capacitor,
wherein the first channel formation region comprises a semiconductor material containing silicon, and the second channel formation region comprises an oxide semiconductor material,
wherein the first gate is electrically connected to one of two electrodes of the capacitor and one of the second source and the second drain,
wherein the capacitor is configured to hold a voltage between the two electrodes of the capacitor by turning off the second transistor,
wherein the first driver circuit is electrically connected to one of the first drain and the first source through the bit line and electrically connected to the other of the second drain and the second source through the signal line,
wherein the second driver circuit is electrically connected to the other of the two electrodes of the capacitor through the read word line and electrically connected to the second gate through the write word line, and
wherein the potential conversion circuit outputs a potential lower than a reference potential to the second driver circuit.

2. A semiconductor device comprising:
a write word line;
a read word line;
a bit line;
a source line;
a signal line;
a memory cell array including a plurality of memory cells;
a first driver circuit;
a second driver circuit; and
a potential conversion circuit,
wherein one of the plurality of memory cells comprises:
   a first transistor including a first gate, a first source, a first drain, and a first channel formation region;
   a second transistor including a second gate, a second source, a second drain, and a second channel formation region; and
   a capacitor,
wherein the first channel formation region includes a semiconductor material different from a semiconductor material of the second channel formation region,
wherein the first gate is electrically connected to one of two electrodes of the capacitor and one of the second source and the second drain,
wherein the capacitor is configured to hold a voltage between the two electrodes of the capacitor by turning off the second transistor,
wherein the first driver circuit is electrically connected to one of the first drain and the first source through the bit line and electrically connected to the other of the second drain and the second source through the signal line,
wherein the second driver circuit is electrically connected to the other of the two electrodes of the capacitor through the read word line and electrically connected to the second gate through the write word line, and
wherein the potential conversion circuit outputs a potential lower than a reference potential to the second driver circuit.

3. A semiconductor device comprising:
a write word line;
a read word line;
a bit line;
a source line;
a signal line;
a memory cell array including a plurality of memory cells;

a first driver circuit;
a second driver circuit; and
a potential conversion circuit,
wherein one of the plurality of memory cells comprises:
- a first transistor including a first gate, a first source, a first drain, and a first channel formation region;
- a second transistor including a second gate, a second source, a second drain, and a second channel formation region; and
- a capacitor, wherein the first channel formation region includes a semiconductor material different from a semiconductor material of the second channel formation region, wherein the first gate is electrically connected to one of two electrodes of the capacitor and one of the second drain and the second source, wherein the capacitor is configured to hold a voltage between the two electrodes of the capacitor by turning off the second transistor, wherein the first driver circuit is electrically connected to one of the first drain and the first source through the bit line and electrically connected to the other of the second drain and the second source through the signal line, wherein the second driver circuit is electrically connected to the other of the two electrodes of the capacitor through the read word line and electrically connected to the second gate through the write word line, and wherein the potential conversion circuit outputs a potential lower than a reference potential and a potential higher than a power supply potential to the second driver circuit.

4. The semiconductor device according to claim 1, wherein the plurality of memory cells is connected in parallel between the bit line and the source line.

5. The semiconductor device according to claim 2, wherein the plurality of memory cells is connected in parallel between the bit line and the source line.

6. The semiconductor device according to claim 3, wherein the plurality of memory cells is connected in parallel between the bit line and the source line.

7. The semiconductor device according to claim 2, wherein the second channel formation region of the second transistor includes an oxide semiconductor.

8. The semiconductor device according to claim 3, wherein the second channel formation region of the second transistor includes an oxide semiconductor.

9. The semiconductor device according to claim 1, wherein the first driver circuit comprises a delay circuit electrically connected to the signal line.

10. The semiconductor device according to claim 2, wherein the first driver circuit comprises a delay circuit electrically connected to the signal line.

11. The semiconductor device according to claim 3, wherein the first driver circuit comprises a delay circuit electrically connected to the signal line.

12. The semiconductor device according to claim 1, wherein the second driver circuit includes a level shift circuit electrically connected to the potential conversion circuit and the write word line or the read word line.

13. The semiconductor device according to claim 2, wherein the second driver circuit includes a level shift circuit electrically connected to the potential conversion circuit and the write word line or the read word line.

14. The semiconductor device according to claim 3, wherein the second driver circuit includes a level shift circuit electrically connected to the potential conversion circuit and the write word line or the read word line.

* * * * *